United States Patent [19]
Zhu

[11] Patent Number: 5,821,887
[45] Date of Patent: Oct. 13, 1998

[54] METHOD AND APPARATUS FOR DECODING VARIABLE LENGTH CODES

[75] Inventor: Chunrong Zhu, Portland, Oreg.

[73] Assignee: Intel Corporation, Santa Clara, Calif.

[21] Appl. No.: 747,980

[22] Filed: Nov. 12, 1996

[51] Int. Cl.[6] .................................................. H03M 7/40
[52] U.S. Cl. ........................................................... 341/67
[58] Field of Search .............................. 341/67, 107, 106, 341/65, 55, 87; 358/133; 382/56

[56] References Cited

U.S. PATENT DOCUMENTS

| | | | |
|---|---|---|---|
| 3,883,847 | 5/1975 | Frank | 340/146.1 |
| 4,369,463 | 1/1983 | Anastassiou et al. | 358/135 |
| 4,386,416 | 5/1983 | Giltner et al. | 364/900 |
| 4,396,906 | 8/1983 | Weaver | 340/347 |
| 4,563,671 | 1/1986 | Lim et al. | 340/347 |
| 4,574,382 | 3/1986 | Ko | 375/25 |
| 4,580,162 | 4/1986 | Mori | 358/135 |
| 4,593,267 | 6/1986 | Kuroda et al. | 340/347 |
| 4,700,175 | 10/1987 | Bledsoe | 341/347 |
| 4,706,265 | 11/1987 | Furukawa | 375/122 |
| 4,813,056 | 3/1989 | Fedele | 375/27 |
| 4,899,149 | 2/1990 | Kahan | 341/67 |
| 4,967,196 | 10/1990 | Sprague et al. | 341/67 |
| 5,045,853 | 9/1991 | Astle et al. | 341/67 |
| 5,057,917 | 10/1991 | Shalkauser et al. | 358/135 |
| 5,220,325 | 6/1993 | Ackland et al. | 341/67 |
| 5,253,053 | 10/1993 | Chu et al. | 358/133 |
| 5,268,769 | 12/1993 | Tsuchiya et al. | 358/427 |
| 5,304,995 | 4/1994 | Dachiku | 341/67 |
| 5,329,313 | 7/1994 | Keith | 348/422 |
| 5,528,628 | 6/1996 | Park et al. | 375/240 |

FOREIGN PATENT DOCUMENTS

| | | |
|---|---|---|
| 0 145 396 | 6/1985 | European Pat. Off. . |
| WO 89/05556 | 6/1989 | WIPO . |

OTHER PUBLICATIONS

Norman Abramson, "Information Theory and Coding", McGraw–Hill Book Company, pp. 76–85. (No Date Given).

Kevin Harney, Mike Keith, Gary Lavelle, Lawrence D. Ryan and Daniel J. Stark, The i750 Video Processor: A Total Multimedia Solution, Communications of the ACM, Apr. 1991/vol. 34, No. 4, pp. 65–78.

Stuart J. Golin, "Image Processing Algorithms and Techniques III", SPIE vol. 1657 (1992), pp. 106–113.

"Data Processing Method", vol. 11 No. 83 (E–489) (2530) Mar. 3, 1987.

"Teleconferencing systems facilitate collaboration and distance learning", T H E Journal (Technological Horizons In Education) vol. 22, No. 3, pp. 2–10. (Oct. 1994).

Primary Examiner—Brian K. Young
Attorney, Agent, or Firm—Blakely, Sokoloff, Taylor & Zafman

[57] ABSTRACT

A method and apparatus for performing variable length decoding on a coded bitstream produced by an encoding apparatus is provided. The coded bitstream includes one or more variable length codes (VLCs) produced by a Huffman code. Upon receiving the coded bitstream, for each of the VLCs in the coded bitstream a determination is made as to which of a major table or a minor table contains an entry corresponding to the VLC. The major table has been statistically optimized to contain entries corresponding to frequently used VLCs. The minor table has been optimized for space and contains entries corresponding to VLCs that are less frequently used. The optimized tables provide a more efficient method and apparatus for decoding variable length codes. Specifically, the optimized tables provide a method of variable length decoding that can run efficiently on a target platform having a limited data and code cache.

12 Claims, 13 Drawing Sheets

METHOD AND APPARATUS FOR DECODING VARIABLE LENGTH CODES

FIELD OF THE INVENTION

The invention relates generally to the field of video signal processing. More specifically, the invention relates to real-time decoding of encoded digital video signals with variable length codes.

BACKGROUND OF THE INVENTION

In real time digital video systems, compression and decompression of the video data typically involves variable length coding (e.g., representing fixed length codes with variable length codes) and variable length code decoding. One of the best known variable length codes is the Huffman code which will be described in more detail below. Fast variable length coding is generally accomplished using a table driven method. That is, a table can be used to associate a variable length code with a fixed length code; thus, allowing the variable length code representation to be determined for a given code by performing a table lookup. Importantly, the word "table" is used generically in this specification to mean any data structure that would facilitate data storage and retrieval (e.g., an array, hash table, linked list, binary search tree, or equivalent data structure). In this example, the fixed length code would serve as the index to a variable length encoding table and each table entry would contain the corresponding variable length code. During the encoding process, a table entry can be accessed by indexing into the variable length encoding table with the fixed length code. The variable length code retrieved from the table entry can then be used to replace the occurrence of the fixed length code in the resulting coded video bitstream. During the decoding process, a similar table can be accessed to reverse the variable length coding process (variable length decoding). The variable length decoding process essentially involves determining the fixed length code corresponding to each variable length code in the coded video bitstream. This variable length decoding table, however, is indexed by the variable length code and the table entries contain the corresponding fixed length codes. To help put the present invention into context, the processes of video encoding and decoding will now briefly be described with reference to FIG. 1.

FIG. 1 is a high level flow diagram illustrating encoding of video frame data and decoding of a coded video bitstream. Video frame data is input to the encoding process, steps 100 through 130 and 155, and ultimately a coded video bitstream is produced. The coded video bitstream is decoded by the decoding process, steps 135 through 150.

At step 155, current video frame data and previous video frame data are input into a motion estimation process. The output of the motion estimation process serves as the input to step 100.

At step 100, the output of step 155 is accepted and motion compensation prediction is performed. The output of the motion compensation prediction stage is spatial block data. The resulting spatial block data serves as the input to step 105.

At step 105, Discrete Cosine Transform (DCT) coding changes the information from a spatial domain to a frequency domain. The DCT coding process is performed to transform the video data into a form in which redundancy can be identified and reduced. The output of the DCT coding step frequency block data in the form of DCT coefficients (transform coefficients).

The frequency block data is then quantized and scanned in zig-zag, order. The quantization process, step 110, discards information which has little or no visual significance by reducing the precision of the frequency block coefficients to the minimum level required to achieve the desired image quality. The goal of the quantization process is to increase the number of zero coefficients so the information can be compressed more easily.

The quantized data is then scanned using a Zig-Zag scan at step 115. The Zig-Zag scan produces a stream of non-zero quantized coefficient values that are separated by strings of zeros.

At step 120, run length coding is performed on the Zig-Zag scanned data. The run length coding process replaces the strings of zeros with a number that indicates the number of zeros (the "run-length" of zeros) between non-zero coefficients.

Next, the run length coded data is fed into a variable length coder at step 125. Variable length codes typically associate short codes with frequently occurring events and longer codes with events that occur infrequently. As discussed earlier, table driven methods are typically used for variable length coding and decoding. For example, the ITU-T Recommendation H.263, discussed in more detail later, employs a fixed Huffman codebook to produce variable length codes corresponding to the run length coded data. This H.263 codebook will be discussed further in connection with Table 1.

Finally, the variable length coded data is assembled into a video bitstream at step 130. Upon receiving the video bitstream, a decoder reverses the encoding process just described, steps 136 through 150.

The codec, encoder, or decoder that performs the processing described above can be implemented, for example, with a general purpose processor running one or more programs. The computer system upon which one embodiment of the present invention can be implemented will be described further with respect to FIG. 2. Of course, those of ordinary skill in the art will recognize that off the shelf components or application specific integrated circuits ("ASICs") can be used as well.

Referring now to FIG. 3, a typical prior art variable length decode table will be described. FIG. 3 illustrates a memory containing an example of a typical one-level lookup table used for variable length decoding. The main memory 204 has stored therein a variable length decode table 310. The main memory 204 further includes a run length decode table 335, an inverse quantization table 355, and a motion vector table 375.

Prior art decoders typically use a one-level table for variable length decoding. The one-level table has entries containing indirect values used as indices into other tables. For example, the variable length decode table 310 contains an index for run length decode 320 and an index for inverse quantization 325. The variable length decode table 310 is indexed by a variable length code (VLC) field 315. Each variable length code has a corresponding table entry which includes the index for run length decode 320, the index for inverse quantization 325, and a bits field 330. The index for run length decode 320 is an indirect value that is used to further index another table, the run length decode table 335. The index for inverse quantization 325 is an indirect value that is used to index the inverse quantization table 355. The run length decode table 335 and the inverse quantization table 355 contain direct values, run length 350 and value 370 respectively.

Motion vector table 375 is also indexed by a variable length code (VLC) 380. Each variable length code has a corresponding table entry which includes a set of motion vector data 385 and a bits field 390.

FIG. 4 is a flow diagram of a prior art video decoding method employing the tables of FIG. 3. The variable length decoding processing block 400 comprises steps 405, 410, and 415. At step 405, a VLC from the compressed video bitstream is used to index into the variable length decode table 310 to retrieve the index for the run length decode table 320 and the index for the inverse quantization table 325. After retrieving the indices from the variable length decode table 310, they are stored for later use at steps 410 and 415.

The run length decoding processing block 420 comprises steps 425 and 430. At step 425, the previously stored index for the run length decode table is used to retrieve the run length from the run length decode table. Then, run length decoding is performed based upon the run length, step 430.

The inverse quantization processing block 440 comprises steps 445 and 450. A value is retrieved from the inverse quantization table by indexing into the table with the index retrieved from the variable length decode table. Then, the dequantized value is obtained by an inverse quantization module at step 450.

Inverse discrete cosine transform (DCT) processing is performed at step 460. The motion compensation processing block 470 comprises steps 475 and 480. The motion vector data is retrieved from the motion vector table 375 by indexing into the table with yet another VLC corresponding to the motion vector data. Upon retrieving the motion vector data, motion compensation is performed, step 480.

A number of disadvantages of the prior art decoding method have been observed by the assignees of the present invention. First, the one-level table approach makes inefficient usage of memory. The number of table entries in the one-level table is defined by the longest variable length code (VLC) in the coding scheme. For example, a coding scheme whose longest VLC is 13 bits would require $2^{13-1}$ (4,096) table entries. As will be discussed further later, only a subset of these table entries is actually required.

Another limitation of the one-level table approach is the whole lookup table cannot be stored in data cache. Therefore, with this prior method as the VLCs are being decoded, many read misses inevitably occur causing valuable processing time to be wasted executing wait states while data is retrieved from main memory.

A further disadvantage of the prior art approach is the fact that it stores indirect values in the table entries rather than direct values. As illustrated above in FIG. 3 and FIG. 4, these indirect values require another table lookup to arrive at the data of interest.

In general, it is desirable to provide a more efficient method and apparatus for decoding variable length codes. It is also desirable to provide a method of variable length decoding that can run efficiently on a target platform having a limited data and code cache. Further, it is desirable to provide direct values in the lookup tables rather that indirect values to streamline the decoding process.

Importantly, the most common method used to achieve superior memory performance while maintaining an acceptable system cost is by implementing a cache memory subsystem. Typically, the cache memory subsystem includes a main memory with relatively slow access and relatively cheap dynamic random access memory (DRAM). The cache memory subsystem further includes a small amount of fast static random access memory (SRAM) that provides fast access. In a computer system that includes a cache memory subsystem, it is advantageous to maximize the number of cache hits thereby minimizing the number of costly accesses to main memory. Recognizing the importance of cache management, it is desirable to provide a method for variable length decoding in which the required lookup tables fit within the data cache.

SUMMARY OF THE INVENTION

A method and apparatus for performing variable length decoding on a coded bitstream produced by an encoding apparatus is disclosed. The coded bitstream includes one or more variable length codes (VLCs) produced by a Huffman code.

Upon receiving the coded bitstream, for each of the VLCs in the coded bitstream a determination is made as to which of a major table or a minor table contains an entry corresponding to the VLC.

The major table contains entries corresponding to frequently used VLCs and the minor table contains entries corresponding to VLCs that are less frequently used.

Based upon the determination, the entry corresponding to the VLC is retrieved from the appropriate table.

According to one aspect of the invention, the determination includes concurrently indexing into the major table and the minor table.

According to another aspect of the invention, the longest VLC is x bits and both the major table and the minor table are indexed with less than x bits.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENT

Figure 1:
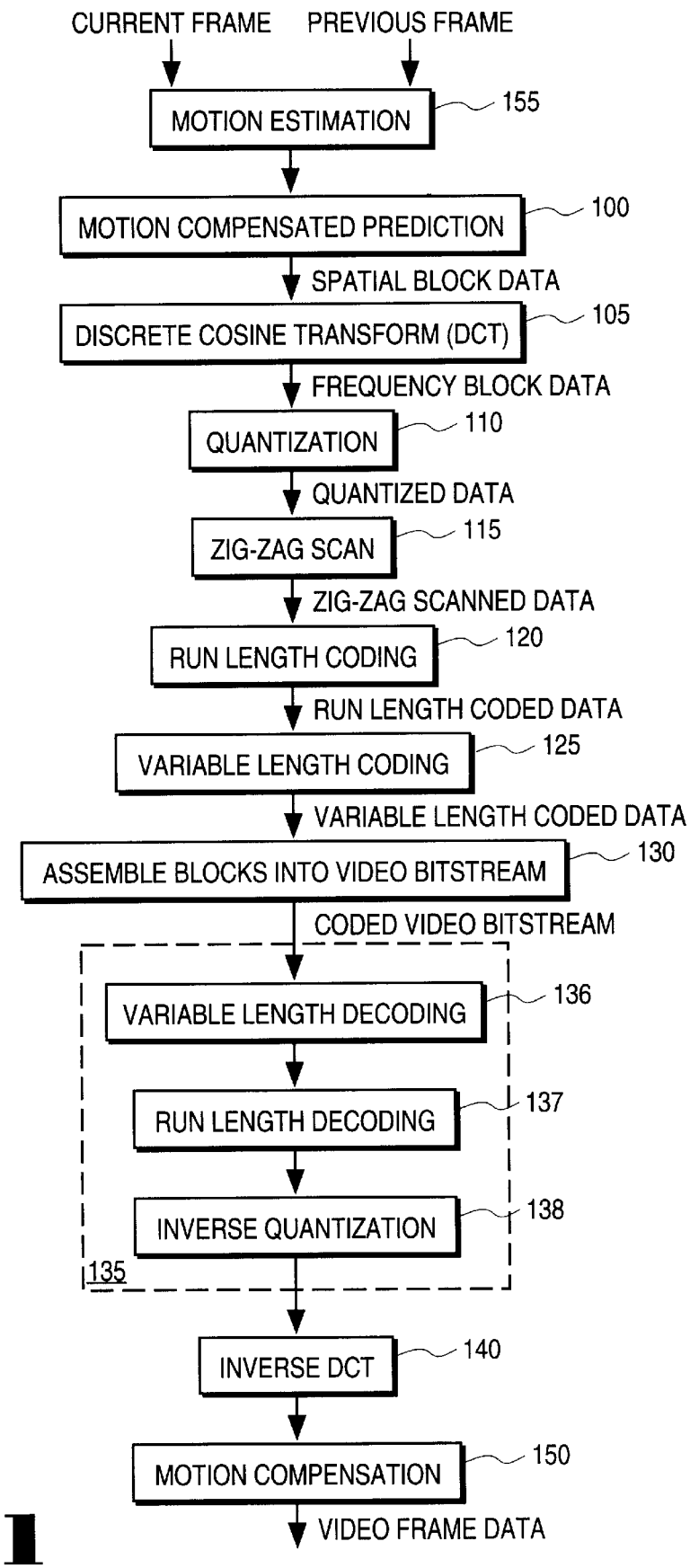
FIG. 1 is a high level flow diagram illustrating encoding of video frame data and decoding of a coded video bitstream.

A method and apparatus for variable length decoding that can run efficiently on a target platform having a limited data and code cache is described. In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form.

HUFFMAN CODING

It may now be instructive to describe some characteristics of Huffman coding that are exploited by the present invention. Huffman codes are developed by studying the probability of different code values to be transmitted. Generally, the lower the probability of a code being transmitted the longer the wordlength of the corresponding variable length code. Thus, frequently transmitted codes are assigned shorter variable length codes and less frequently transmitted codes are assigned longer variable length codes. Further, to aid deserializing, short codes are not prefixes of longer codes. Therefore, the assignee of the present invention has observed that increased speed and efficiency can be achieved, for example, by employing statistically optimized two-level variable length decoding tables.

The tables of the present invention were built based on statistical characteristics of Huffman codes. For example, the first level table (the Major Table) preferably is small in size and contains decoded entries that are used about 80% of the time or more. While the second level table (the Minor Table) contains decoded entries that are used during the remainder of the time. Many video compression techniques employ Huffman coding as part of their overall compression scheme. For the sake of example, however, the preferred embodiment of the present invention will now be described with respect to the Huffman coding scheme employed in the Telecommunication Standardization Sector of the International Telecommunication Union (ITU-T) in Recommendation H.263.

ITU-T RECOMMENDATION H.263

The ITU-T has specified a coded representation useful for compressing the moving picture portion of a low bitrate audio-visual service. This coded representation is described in Recommendation H.263 entitled "Video Coding For Low Bitrate Communication." ITU-T Recommendation H.263, 1995 (hereinafter H.263).

Importantly, while one embodiment of the present invention will be described with respect to the H.263 codebooks, those of ordinary skill in the art will appreciate that the present invention is not limited to any particular variable length coding scheme. For example, the method and apparatus of the present invention are not limited to the H.263 variable length coding scheme. Rather, the disclosed method and apparatus is useful for decoding video bitstreams that have been encoded using any Huffman code. This is true because of the characteristics of Huffman coding described earlier. The variable length code table used by H.263 to encode transform coefficients will now briefly be described with reference to Table 1.

TABLE 1

VLC Table for TCOEF

| INDEX | LAST | RUN | LEVEL | BITS | VLC |
|---|---|---|---|---|---|
| 0 | 0 | 0 | 1 | 3 | 10s |
| 1 | 0 | 0 | 2 | 5 | 1111s |
| 2 | 0 | 0 | 3 | 7 | 0101 01s |
| 3 | 0 | 0 | 4 | 8 | 00101 11s |
| 4 | 0 | 0 | 5 | 9 | 0001 1111s |
| 5 | 0 | 0 | 6 | 10 | 0001 001 01s |
| 6 | 0 | 0 | 7 | 10 | 0001 001 00s |
| 7 | 0 | 0 | 8 | 11 | 0000 1000 01s |
| 8 | 0 | 0 | 9 | 11 | 0000 1000 00s |
| 9 | 0 | 0 | 10 | 12 | 0000 0000 111s |
| 10 | 0 | 0 | 11 | 12 | 0000 0000 110s |
| 11 | 0 | 0 | 12 | 12 | 0000 0100 000s |
| 12 | 0 | 1 | 1 | 4 | 110s |
| 13 | 0 | 1 | 2 | 7 | 0101 00s |
| 14 | 0 | 1 | 3 | 9 | 0001 1110s |
| 15 | 0 | 1 | 4 | 11 | 0000 0011 11s |
| 16 | 0 | 1 | 5 | 12 | 0000 0100 001s |
| 17 | 0 | 1 | 6 | 13 | 0000 0101 0000s |
| 18 | 0 | 2 | 1 | 15 | 1110s |
| 19 | 0 | 2 | 2 | 9 | 0001 1101s |
| 20 | 0 | 2 | 3 | 11 | 0000 0011 10s |
| 21 | 0 | 2 | 4 | 13 | 0000 0101 0001s |
| 22 | 0 | 3 | 1 | 6 | 0110 1s |
| 23 | 0 | 3 | 2 | 10 | 0001 0001 1s |
| 24 | 0 | 3 | 3 | 11 | 0000 0011 01s |
| 25 | 0 | 4 | 1 | 6 | 0110 0s |
| 26 | 0 | 4 | 2 | 10 | 0001 0001 0s |
| 27 | 0 | 4 | 3 | 13 | 0000 0101 0010s |
| 28 | 0 | 5 | 1 | 6 | 0101 1s |
| 29 | 0 | 5 | 2 | 11 | 0000 0011 00s |
| 30 | 0 | 5 | 3 | 13 | 0000 0101 0011s |
| 31 | 0 | 6 | 1 | 7 | 0100 11s |
| 32 | 0 | 6 | 2 | 11 | 0000 0010 11s |
| 33 | 0 | 6 | 3 | 13 | 0000 0101 0100s |
| 34 | 0 | 7 | 1 | 7 | 0100 10s |
| 35 | 0 | 7 | 2 | 11 | 0000 0010 10s |
| 36 | 0 | 8 | 1 | 7 | 0100 01s |
| 37 | 0 | 8 | 2 | 11 | 0000 0010 01s |
| 38 | 0 | 9 | 1 | 7 | 0100 00s |
| 39 | 0 | 9 | 2 | 11 | 0000 0010 00s |
| 40 | 0 | 10 | 1 | 8 | 0010 110s |
| 41 | 0 | 10 | 2 | 13 | 0000 0101 0101s |
| 42 | 0 | 11 | 1 | 8 | 0010 101s |
| 43 | 0 | 12 | 1 | 8 | 0010 100s |
| 44 | 0 | 13 | 1 | 9 | 0001 1100s |
| 45 | 0 | 14 | 1 | 9 | 0001 1011s |
| 46 | 0 | 15 | 1 | 10 | 0001 0000 1s |
| 47 | 0 | 16 | 1 | 10 | 0001 0000 0s |
| 48 | 0 | 17 | 1 | 10 | 0000 1111 1s |

TABLE 1-continued

VLC Table for TCOEF

| INDEX | LAST | RUN | LEVEL | BITS | VLC |
|---|---|---|---|---|---|
| 49 | 0 | 18 | 1 | 10 | 0000 1111 0s |
| 50 | 0 | 19 | 1 | 10 | 0000 1101 1s |
| 51 | 0 | 20 | 1 | 10 | 0000 1101 0s |
| 52 | 0 | 21 | 1 | 10 | 0000 1101 1s |
| 53 | 0 | 22 | 1 | 10 | 0000 1101 0s |
| 54 | 0 | 23 | 1 | 12 | 0000 0100 010d |
| 55 | 0 | 24 | 1 | 12 | 0000 0100 011s |
| 56 | 0 | 25 | 1 | 13 | 0000 0101 0110s |
| 57 | 0 | 26 | 1 | 13 | 0000 0101 0111s |
| 58 | 1 | 0 | 1 | 5 | 0111s |
| 59 | 1 | 0 | 2 | 10 | 0000 1100 1s |
| 60 | 1 | 0 | 3 | 12 | 0000 0000 101s |
| 61 | 1 | 1 | 1 | 7 | 0011 11s |
| 62 | 1 | 1 | 2 | 12 | 0000 0000 100s |
| 63 | 1 | 2 | 1 | 7 | 0011 10s |
| 64 | 1 | 3 | 1 | 7 | 0011 01s |
| 65 | 1 | 4 | 1 | 7 | 0011 00s |
| 66 | 1 | 5 | 1 | 8 | 0010 011s |
| 67 | 1 | 6 | 1 | 8 | 0010 010s |
| 68 | 1 | 7 | 1 | 8 | 0010 001s |
| 69 | 1 | 8 | 1 | 8 | 0010 000x |
| 70 | 1 | 9 | 1 | 9 | 0001 1010s |
| 71 | 1 | 10 | 1 | 9 | 0001 1001s |
| 72 | 1 | 11 | 1 | 9 | 0001 1000s |
| 73 | 1 | 12 | 1 | 9 | 0001 0111s |
| 74 | 1 | 13 | 1 | 9 | 0001 0110s |
| 75 | 1 | 14 | 1 | 9 | 0001 0101s |
| 76 | 1 | 15 | 1 | 9 | 0001 0100s |
| 77 | 1 | 16 | 1 | 9 | 0001 0011s |
| 78 | 1 | 17 | 1 | 10 | 0000 1100 0s |
| 79 | 1 | 18 | 1 | 10 | 0000 1011 1s |
| 80 | 1 | 19 | 1 | 10 | 0000 1011 0s |
| 81 | 1 | 20 | 1 | 10 | 0000 1010 1s |
| 82 | 1 | 21 | 1 | 10 | 0000 1010 0s |
| 83 | 1 | 22 | 1 | 10 | 0000 1001 1s |
| 84 | 1 | 23 | 1 | 10 | 0000 1001 0s |
| 85 | 1 | 24 | 1 | 10 | 0000 1000 1s |
| 86 | 1 | 25 | 1 | 11 | 0000 0001 11s |
| 87 | 1 | 26 | 1 | 11 | 0000 0001 10s |
| 88 | 1 | 27 | 1 | 11 | 0000 0001 01s |
| 89 | 1 | 28 | 1 | 11 | 0000 0001 00s |
| 90 | 1 | 29 | 1 | 12 | 0000 0100 100s |
| 91 | 1 | 30 | 1 | 12 | 0000 0100 101s |
| 92 | 1 | 31 | 1 | 12 | 0000 0100 110sa |
| 93 | 1 | 32 | 1 | 12 | 0000 0100 111s |
| 94 | 1 | 33 | 1 | 13 | 0000 0101 1000s |
| 95 | 1 | 34 | 1 | 13 | 0000 0101 1001s |
| 96 | 1 | 35 | 1 | 13 | 0000 0101 1010s |
| 97 | 1 | 36 | 1 | 13 | 0000 0101 1011s |
| 98 | 1 | 37 | 1 | 13 | 0000 0101 1100s |
| 99 | 1 | 38 | 1 | 13 | 0000 0101 1101s |
| 100 | 1 | 39 | 1 | 13 | 0000 0101 1110s |
| 101 | 1 | 40 | 1 | 13 | 0000 0101 1111s |

Table 1 is a Huffman table, "VLC table for TCOEF," specified by H.263 for encoding transform coefficients output from the discrete cosine transform process. H.263 employs fixed Huffman tables for encoding what is calls "events." An event is a 3-tuple defined as {Last, Run, Level }. Where Last is a nonzero coefficient indication, Run indicates the number of successive zeros preceding the coded coefficient, and Level is the nonzero value of the coded transform coefficient. As discussed earlier, the most commonly occurring events are coded into short codes. While other rare events, are assigned longer codes. For example, at index zero, event {0,0,1} is represented with the variable length codes "10s", where s is the sign bit (0 for positive and 1 for negative). At index 17, a more rare event, {0,1,6}, is represented with a 13-bit variable length code "0000 0101 0000s."

In the preferred embodiment, a two-level table is used to reverse the encoding process. This two-level table and the method of using the table will be described in detail below. Table 2 and Table 3 illustrate how the VLC table for TCOEF is divided into a Major table and a Minor table for use in the decoding process.

TABLE 2

Major Table VLCs

| INDEX | LAST | RUN | LEVEL | BITS | VLC |
|---|---|---|---|---|---|
| 0 | 0 | 0 | 1 | 3 | 10s |
| 1 | 0 | 0 | 2 | 5 | 111s |
| 2 | 0 | 0 | 3 | 7 | 0101 01s |
| 12 | 0 | 1 | 1 | 4 | 110s |
| 13 | 0 | 1 | 2 | 7 | 0101 00s |
| 18 | 0 | 2 | 1 | 5 | 1110s |
| 22 | 0 | 3 | 1 | 6 | 0110 1s |
| 25 | 0 | 4 | 1 | 6 | 0110 0s |
| 28 | 0 | 5 | 1 | 6 | 0101 1s |
| 31 | 0 | 6 | 1 | 7 | 0100 11s |
| 34 | 0 | 7 | 1 | 7 | 0100 10s |
| 36 | 0 | 8 | 1 | 7 | 0100 01s |
| 38 | 0 | 9 | 1 | 7 | 0100 00s |
| 58 | 1 | 0 | 1 | 5 | 0111s |
| 61 | 1 | 1 | 1 | 7 | 0011 11s |
| 63 | 1 | 2 | 1 | 7 | 0011 10s |
| 64 | 1 | 3 | 1 | 7 | 0011 01s |
| 65 | 1 | 4 | 1 | 7 | 0011 00s |

TABLE 3

Minor Table VLCs

| INDEX | LAST | RUN | LEVEL | BITS | VLC |
|---|---|---|---|---|---|
| 3 | 0 | 0 | 4 | 8 | 0010 111s |
| 4 | 0 | 0 | 5 | 8 | 0001 1111s |
| 5 | 0 | 0 | 6 | 10 | 0001 0010 1s |
| 6 | 0 | 0 | 7 | 10 | 0001 0010 0s |
| 7 | 0 | 0 | 8 | 11 | 0000 1000 01s |
| 8 | 0 | 0 | 9 | 11 | 0000 1000 00s |
| 9 | 0 | 0 | 10 | 12 | 0000 0000 111s |
| 10 | 0 | 0 | 11 | 12 | 0000 0000 110s |
| 11 | 0 | 0 | 12 | 12 | 0000 0100 000s |
| 14 | 0 | 1 | 3 | 9 | 0001 1110s |
| 15 | 0 | 1 | 4 | 11 | 0000 0011 11s |
| 16 | 0 | 1 | 5 | 12 | 0000 0100 001s |
| 17 | 0 | 1 | 6 | 13 | 0000 0101 0000s |
| 19 | 0 | 2 | 2 | 9 | 0001 1101s |
| 20 | 0 | 2 | 3 | 11 | 0000 0011 10s |
| 21 | 0 | 2 | 4 | 13 | 0000 0101 0001s |
| 23 | 0 | 3 | 2 | 10 | 0001 0001 1s |
| 24 | 0 | 3 | 3 | 11 | 0000 0011 01s |
| 26 | 0 | 4 | 2 | 10 | 0001 0001 0s |
| 27 | 0 | 4 | 3 | 13 | 0000 0101 0010s |
| 29 | 0 | 5 | 2 | 11 | 0000 0011 00s |
| 30 | 0 | 5 | 3 | 13 | 0000 0101 0011s |
| 32 | 0 | 6 | 2 | 11 | 0000 0010 11s |
| 33 | 0 | 6 | 3 | 13 | 0000 0101 0100s |
| 35 | 0 | 7 | 2 | 11 | 0000 0010 10s |
| 37 | 0 | 8 | 2 | 11 | 0000 0010 01s |
| 39 | 0 | 9 | 2 | 11 | 0000 0010 00s |
| 40 | 0 | 10 | 1 | 8 | 0010 110s |
| 41 | 0 | 10 | 2 | 13 | 0000 0101 0101s |
| 42 | 0 | 11 | 1 | 8 | 0010 101s |
| 43 | 0 | 12 | 1 | 8 | 0010 100s |
| 44 | 0 | 13 | 1 | 9 | 0001 1100s |
| 45 | 0 | 14 | 1 | 9 | 0001 1011s |
| 46 | 0 | 15 | 1 | 10 | 0001 0000 1s |
| 47 | 0 | 16 | 1 | 10 | 0001 0000 0s |
| 48 | 0 | 17 | 1 | 10 | 0000 1111 1s |
| 49 | 0 | 18 | 1 | 10 | 0000 1111 0s |
| 50 | 0 | 19 | 1 | 10 | 0000 1110 1s |
| 51 | 0 | 20 | 1 | 10 | 0000 1110 0s |
| 52 | 0 | 21 | 1 | 10 | 0000 1101 1s |
| 53 | 0 | 22 | 1 | 10 | 0000 1101 0s |
| 54 | 0 | 23 | 1 | 12 | 0000 0100 010s |

TABLE 3-continued

Minor Table VLCs

| INDEX | LAST | RUN | LEVEL | BITS | VLC |
|---|---|---|---|---|---|
| 55 | 0 | 24 | 1 | 12 | 0000 0100 011s |
| 56 | 0 | 25 | 1 | 13 | 0000 0101 0110s |
| 57 | 0 | 26 | 1 | 13 | 0000 0101 0111s |
| 59 | 1 | 0 | 2 | 10 | 0000 1100 1s |
| 60 | 1 | 0 | 3 | 12 | 0000 0000 101s |
| 62 | 1 | 1 | 2 | 12 | 0000 0000 100s |
| 66 | 1 | 5 | 1 | 8 | 0010 011s |
| 67 | 1 | 6 | 1 | 8 | 0010 010s |
| 68 | 1 | 7 | 1 | 8 | 0010 001s |
| 69 | 1 | 8 | 1 | 8 | 0010 000s |
| 70 | 1 | 9 | 1 | 9 | 0001 1010s |
| 71 | 1 | 10 | 1 | 9 | 0001 1001s |
| 72 | 1 | 11 | 1 | 9 | 0001 1000s |
| 73 | 1 | 12 | 1 | 9 | 0001 0111s |
| 74 | 1 | 13 | 1 | 9 | 0001 0110s |
| 75 | 1 | 14 | 1 | 9 | 0001 0101s |
| 76 | 1 | 15 | 1 | 9 | 0001 0100s |
| 77 | 1 | 16 | 1 | 9 | 0001 0011s |
| 78 | 1 | 17 | 1 | 10 | 0000 1100 0s |
| 79 | 1 | 18 | 1 | 10 | 0000 1011 1s |
| 80 | 1 | 19 | 1 | 10 | 0000 1011 0s |
| 81 | 1 | 20 | 1 | 10 | 0000 1010 1s |
| 82 | 1 | 21 | 1 | 10 | 0000 1010 0s |
| 83 | 1 | 22 | 1 | 10 | 0000 1001 1s |
| 84 | 1 | 23 | 1 | 10 | 0000 1001 0s |
| 85 | 1 | 24 | 1 | 10 | 0000 1000 1s |
| 86 | 1 | 25 | 1 | 11 | 0000 0001 11s |
| 87 | 1 | 26 | 1 | 11 | 0000 0001 10s |
| 88 | 1 | 27 | 1 | 11 | 0000 0001 01s |
| 89 | 1 | 28 | 1 | 11 | 0000 0001 00s |
| 90 | 1 | 29 | 1 | 12 | 0000 0100 100s |
| 91 | 1 | 30 | 1 | 12 | 0000 0100 101s |
| 92 | 1 | 31 | 1 | 12 | 0000 0100 110s |
| 93 | 1 | 32 | 1 | 12 | 0000 0100 111s |
| 94 | 1 | 33 | 1 | 13 | 0000 0101 1000s |
| 95 | 1 | 34 | 1 | 13 | 0000 0101 1001s |
| 96 | 1 | 35 | 1 | 13 | 0000 0101 1010s |
| 97 | 1 | 36 | 1 | 13 | 0000 0101 1011s |
| 98 | 1 | 37 | 1 | 13 | 0000 0101 1100s |
| 99 | 1 | 38 | 1 | 13 | 0000 0101 1101s |
| 100 | 1 | 39 | 1 | 13 | 0000 0101 1110s |
| 101 | 1 | 40 | 1 | 13 | 0000 0101 1111s |

In the preferred embodiment, the Major Table contains all entries corresponding to variable length codes of less than eight bits. Accordingly, the Minor Table contains all entries corresponding to variable length codes of eight bits or more. The result is a relatively small Major Table that easily fits within a limited data cache and a larger Minor Table. As can now be observed with reference to Table 3, this division was chosen to fall prior to a run of consecutive zeros. This run of consecutive zeros allows substantial savings in the storage requirements of the Minor Table. In this example, each variable length code of eight bits or more has at least three leading zeros. Thus, the table need only be indexed by ten of the thirteen bits, resulting in a saving factor of eight. That is, the table can be stored in one-eighth of the space required to store the same table indexed by the full thirteen bits.

In the preferred embodiment, the Major Table and the Minor Table are data structures that are built or declared by a program when executed by processor 202 and stored in main memory 204. However, it is appreciated that these tables could, alternatively, be stored in ROM 206, the mass storage device 207, or any other equivalent storage device. The tables simply need to be accessible to the decoding process. Preferably the table entries for the Major Table have the form described by Table 4.

TABLE 4

Major Table Entry Format

| Bits | Name | Description |
|---|---|---|
| 25–18 | Bits | Number of bitstream bits used for the variable length code. |
| 17 | Last | Flag for the last transform coefficient.<br>0 - There are more nonzero transform coefficients in this block.<br>1 - This is the last nonzero transform coefficient in this block. |
| 16–9 | Run | Number of preceding transform coefficients having the value zero, plus one. |
| 8–2 | Level | Absolute value of the transform coefficient. |
| 1 | Sign | Sign of the transform coefficient.<br>0 - Positive<br>1 - Negative |
| 0 | Hit | Flag indicating whether the decoded event is contained in the Major table or the Minor table.<br>0 - Major table hit<br>1 - Major table miss |

In assembly code, an ememplary declaration for the Major table could appear as follows:

```
032 gTAB_TCOEF_MAJOR [256] -{
0x3,
0x3, 0x3, 0x3, 0x3, 0x3, 0x1, 0x3,
0x3, 0x3, 0x3, 0x3, 0x3, 0x203, 0x203, 0x3,
0x3, 0x3, 0x3, 0x3, 0x3, 0x203, 0x203, 0x3,
0x3, 0x3, 0x3, 0x3, 0x3, 0x203, 0x203, 0x221204,
0x221206, 0x221004, 0x221006, 0x220e04, 0x220e06, 0x220c04, 0x220c06, 0x201a04,
0x201a06, 0x201804, 0x201806, 0x201604, 0x201606, 0x200210, 0x200212, 0x1c0a04,
0x1e0a04, 0x1e0a06, 0x1e0a06, 0x1e0804, 0x1e0804, 0x1e0806, 0x1e0806, 0x1e0604,
0x1e0606, 0x1e0606, 0x1e0606, 0x1c0404, 0x1e0404, 0x1e0406, 0x1e0406, 0x1c1404,
0x1c1404, 0x1c1406, 0x1c1406, 0x1c1204, 0x1c1204, 0x1c1206, 0x1c1206, 0x1c1004,
0x1c1004, 0x1c1006, 0x1c1006, 0x1c0e04, 0x1c0e04, 0x1c0e06, 0x1c0e06, 0x1c0408,
0x1c0408, 0x1c040a, 0x1c040a, 0x1c020c, 0x1c020c, 0x1c020e, 0x1c020e, 0x180c04,
0x180c04, 0x180c04, 0x180c04, 0x180c06, 0x180c06, 0x180c06, 0x180c06, 0x180a04,
0x180a04, 0x180a04, 0x180a04, 0x180a06, 0x180a06, 0x180a06, 0x180a06, 0x180804,
0x180804, 0x180804, 0x180804, 0x180806, 0x180806, 0x180806, 0x180806, 0x160204,
0x160204, 0x150204, 0x160204, 0x160204, 0x160204, 0x160204, 0x160204, 0x160206,
0x160206, 0x160206, 0x160206, 0x160206, 0x160206, 0x160206, 0x160206, 0xc204,
0xc0204, 0xc0204, 0xc0204, 0xc0204, 0xc0204, 0xc0204, 0xc0204, 0xc0204,
```

-continued

```
0xc0204, 0xc0204, 0xc0204, 0xc0204, 0xc0204, 0xc0204, 0xc0204, 0xc0204,
0xc0204, 0xc0204, 0xc0204, 0xc0204, 0xc0204, 0xc0204, 0xc0204, 0xc0204,
0xc0204, 0xc0204, 0xc0204, 0xc0204, 0xc0204, 0xc0204, 0xc0204, 0xc0206,
0xc0206, 0xc0206, 0xc0206, 0xc0206, 0xc0206, 0xc0206, 0xc0206, 0xc0206,
0xc0206, 0xc0206, 0xc0206, 0xc0206, 0xc0206, 0xc0206, 0xc0206, 0xc0206,
0xc0206, 0xc0206, 0xc0206, 0xc0206, 0xc0206, 0xc0206, 0xc0206, 0xc0206,
0xc0206, 0xc0206, 0xc0206, 0xc0206, 0xc0206, 0xc0206, 0xc0206, 0x100404,
0x100404, 0x100404, 0x100404, 0x100404, 0x100404, 0x100404, 0x100404, 0x100404,
0x100404, 0x100404, 0x100404, 0x100404, 0x100404, 0x100404, 0x100404, 0x100406,
0x100406, 0x100406, 0x100406, 0x100406, 0x100406, 0x100406, 0x100406, 0x100406,
0x100406, 0x100406, 0x100406, 0x100406, 0x100406, 0x100406, 0x100406, 0x140604,
0x100604, 0x100604, 0x100604, 0x100604, 0x100604, 0x100604, 0x100604, 0x140606,
0x140606, 0x140606, 0x140606, 0x140606, 0x140606, 0x140606, 0x140606, 0x140208,
0x140208, 0x140208, 0x140208, 0x140208, 0x140208, 0x140208, 0x140208, 0x14020a,
0x14020a, 0x14020a, 0x14020a, 0x14020a, 0x14020a, 0x14020a, 0x14020a
};    //total 1024
```

It is instructive at this point to walk through an example of how to interpret the above table entries. In the exemplary Major Table, there are 256 entries each having the form described by Table 4. The table is indexed by variable length codes having values 0 through 255. For example, assume the first eight bits received in the coded video bitstream are (0000 0001). This corresponding decoded entry would be found by indexing into the Major Table at index 128 (00000001b). In the Major Table, index 128 contains the hexadecimal value C0204h. Looking at this hexadecimal entry value in binary form with bit zero on the left, results in 0010 0000 0100 0000 0011b.

Bit 0 is 0, representing a Major Table hit. Thus, the decoded entry corresponding to the variable length code contained within the first eight bits of the video coded bitstream, (0000 0001), is present in the Major Table. It is important to note that had bit 0 been a 1, then the decoded entry corresponding to the variable length code would not be found in the Major Table and the Minor Table would have to be accessed.

The next bit of the decoded table entry, bit 1, is also 0, therefore the sign of the transform coefficient contained within this decoded table entry is positive.

Bits 2–8 of the decoded table entry, (10 0000 0), represent the absolute value of the transform coefficient. In this example, the absolute value of the transform coefficient is one.

Bits 9–16 of the decoded table entry, (100 0000 0), represent the one more than the actual number of consecutive transform coefficients having the value zero between two non-zero transform coefficients. Here, therefore, there were no preceding transform coefficient having the value zero.

The video bitstream is divided into a number of blocks. Bit 17, "Last," is a flag that indicates whether or not the current transform coefficient is the last nonzero transform coefficient for a given block in the video bitstream. In this example, bit 17 is 0, therefore, there are more nonzero transform coefficients in the block.

Bits 18–25 indicate to the variable length decoder the number of bits from the video bitstream to use for the variable length code. Here, bits 18–25 are (11 0000 00), therefore the three right most bits of the coded video bitstream represent the variable length code.

Thus, in this example, the first variable length code contained within the first eight bits of the compressed video bitstream has been decoded as event {0,0,1}, see index 0 of the Table 1, above.

At this point, the existence of duplicate decoded entries in above assembly code table should be explained. Duplicates are found in the table because while the table is indexed by eight bits, some of the variable length codes have only three to seven bits. Thus, when looking up a three bit variable length code, five bits are "don't cares." That is, the same decoded entry should be stored in the decode table for all permutations of the five least significant bits of the eight bit portion of the compressed video bitstream. For example, for the variable length code 100 (e.g., xxxxx001), the following bits patterns in the compressed video bitstream all result in the same decoded table entry: 00000001, 00001001, 00010001, 00011001, 00100001, 00101001, 00110001, 00111001 . . . 11111001. Therefore, for variable length code 100, the Major Table contains thirty-two duplicate entries containing the hexadecimal value C0204.

Preferably the table entries for the Minor Table have the form described by Table 5. The entries are essentially identical to those contained in the Major Table, but right shifted by 1 bit because no Hit flag is required for the Minor Table.

TABLE 5

Minor Table Entry Format

| Bits | Name | Description |
| --- | --- | --- |
| 24–17 | Bits | Number of bitstream bits used for the variable length code. |
| 16 | Last | Flag for the last transform coefficient.<br>0 - There are more nonzero transform coefficients in this block.<br>1 - This is the last nonzero transform coefficient in this block. |
| 15–8 | Run | Number of preceding transform coefficients having the value zero, plus one. |
| 7–1 | Level | Absolute value of the transform coefficient. |
| 0 | Sign | Sign of the transform coefficient.<br>0 - Positive<br>1 - Negative |

In a similar manner, a Major Table and a Minor Table can be used for fast variable length decoding of variable length coded motion vector data (MVD). The VLC table used by H.263 to encode MVD is illustrated below in Table 6.

TABLE 6

VLC table for MVD

| Index | Vector differences | | Bit number | Codes |
|---|---|---|---|---|
| 0 | −16 | 16 | 13 | 0000 0000 0010 1 |
| 1 | −15.5 | 16.5 | 13 | 0000 0000 0011 1 |
| 2 | −15 | 17 | 12 | 0000 0000 0101 |
| 3 | −14.5 | 17.5 | 12 | 0000 0000 0111 |
| 4 | −14 | 18 | 12 | 0000 0000 1001 |
| 5 | −13.5 | 18.5 | 12 | 0000 0000 1011 |
| 6 | −13 | 19 | 13 | 0000 0000 1101 |
| 7 | −12.5 | 19.5 | 12 | 0000 0000 1111 |
| 8 | −12 | 20 | 11 | 0000 0001 001 |
| 9 | −11.5 | 20.5 | 11 | 0000 0001 011 |
| 10 | −11 | 21 | 11 | 0000 0001 101 |
| 11 | −10.5 | 21.5 | 11 | 0000 0001 111 |
| 12 | −10 | 22 | 11 | 0000 0010 001 |
| 13 | −9.5 | 22.5 | 11 | 0000 0010 011 |
| 14 | −9 | 23 | 11 | 0000 0010 101 |
| 15 | −8.5 | 23.5 | 11 | 0000 0010 111 |
| 16 | −8 | 24 | 11 | 0000 0011 001 |
| 17 | −7.5 | 24.5 | 11 | 0000 0011 011 |
| 18 | −7 | 25 | 11 | 0000 0011 101 |
| 19 | −6.5 | 25.5 | 11 | 0000 0011 111 |
| 20 | −6 | 26 | 11 | 0000 0100 001 |
| 21 | −5.5 | 26.5 | 11 | 0000 0100 011 |
| 22 | −5 | 27 | 10 | 0000 0100 11 |
| 23 | −4.5 | 37.5 | 10 | 0000 0101 01 |
| 24 | −4 | 28 | 10 | 0000 0101 11 |
| 25 | −3.5 | 28.5 | 8 | 0000 0111 |
| 26 | −3 | 29 | 8 | 0000 1001 |
| 27 | −2.5 | 29.5 | 8 | 0000 1011 |
| 28 | −2 | 30 | 7 | 0000 111 |
| 29 | −1.5 | 30.5 | 5 | 0001 1 |
| 30 | −1 | 31 | 4 | 0011 |
| 31 | −0.5 | 31.5 | 3 | 011 |
| 32 | 0 | | 1 | 1 |
| 33 | 0.5 | −31.5 | 3 | 010 |
| 34 | 1 | −31 | 4 | 0010 |
| 35 | 1.5 | −30.5 | 5 | 0001 0 |
| 36 | 2 | −30 | 7 | 0000 110 |
| 37 | 2.5 | −29.5 | 8 | 0000 1010 |
| 38 | 3 | −29 | 8 | 0000 1000 |
| 39 | 3.5 | −28.5 | 8 | 0000 0110 |
| 40 | 4 | −28 | 10 | 0000 0101 10 |
| 41 | 4.5 | −27.5 | 10 | 0000 0101 00 |
| 42 | 5 | −27 | 10 | 0000 0100 10 |
| 43 | 5.5 | −26.5 | 11 | 0000 0100 010 |
| 44 | 6 | −26 | 11 | 0000 0100 000 |
| 45 | 6.5 | −25.5 | 11 | 0000 0011 110 |
| 46 | 7 | −25 | 11 | 0000 0011 100 |
| 47 | 7.5 | −24.5 | 11 | 0000 0011 010 |
| 48 | 8 | −24 | 11 | 0000 0011 000 |
| 49 | 8.5 | −23.5 | 11 | 0000 0010 110 |
| 50 | 9 | −23 | 11 | 0000 0010 100 |
| 51 | 9.5 | −22.5 | 11 | 0000 0010 010 |
| 52 | 10 | −22 | 11 | 0000 0010 000 |
| 53 | 10.5 | −21.5 | 11 | 0000 0001 110 |
| 54 | 11 | −21 | 11 | 0000 0001 100 |
| 55 | 11.5 | −20.5 | 11 | 0000 0001 010 |
| 56 | 12 | −20 | 11 | 0000 0001 000 |
| 57 | 12.5 | −19.5 | 12 | 0000 0000 1110 |
| 58 | 13 | −19 | 12 | 0000 0000 1100 |
| 59 | 13.5 | −18.5 | 12 | 0000 0000 1010 |
| 60 | 14 | −18 | 12 | 0000 0000 1000 |
| 61 | 14.5 | −17.5 | 12 | 0000 0000 0110 |
| 62 | 15 | −17 | 12 | 0000 0000 0100 |
| 63 | 15.5 | −16.5 | 13 | 0000 0000 0011 0 |

Tables 7 and 8 illustrate one way of dividing the VLCs of Table 6 into a table that includes the most frequently used VLCs and a table that includes less frequently used VLCs. From these a Major Table and a Minor Table can be built for use by a decoding apparatus.

TABLE 7

Major Table VLCs for MVD

| Index | Vector differences | | Bit number | Codes |
|---|---|---|---|---|
| 25 | −3.5 | 28.5 | 8 | 0000 0111 |
| 26 | −3 | 29 | 8 | 0000 1001 |
| 27 | −2.5 | 29.5 | 8 | 0000 1011 |
| 28 | −2 | 30 | 7 | 0000 111 |
| 29 | −1.5 | 30.5 | 5 | 0001 1 |
| 30 | −1 | 31 | 4 | 0011 |
| 31 | −0.5 | 31.5 | 3 | 011 |
| 32 | 0 | | 1 | 1 |
| 33 | 0.5 | −31.5 | 3 | 010 |
| 34 | 1 | −31 | 4 | 0010 |
| 35 | 1.5 | −30.5 | 5 | 0001 0 |
| 36 | 2 | −30 | 7 | 0000 110 |
| 37 | 2.5 | −29.5 | 8 | 0000 1010 |
| 38 | 3 | −29 | 8 | 0000 1000 |
| 39 | 3.5 | −28.5 | 8 | 0000 0110 |

TABLE 8

Minor Table VLCs for MVD

| Index | Vector differences | | Bit number | Codes |
|---|---|---|---|---|
| 0 | −16 | 16 | 13 | 0000 0000 0010 1 |
| 1 | −15.5 | 16.5 | 13 | 0000 0000 0011 1 |
| 2 | −15 | 17 | 12 | 0000 0000 0101 |
| 3 | −14.5 | 17.5 | 12 | 0000 0000 0111 |
| 4 | −14 | 18 | 12 | 0000 0000 1001 |
| 5 | −13.5 | 18.5 | 12 | 0000 0000 1011 |
| 6 | −13 | 19 | 13 | 0000 0000 1101 |
| 7 | −12.5 | 19.5 | 12 | 0000 0000 1111 |
| 8 | −12 | 20 | 11 | 0000 0001 001 |
| 9 | −11.5 | 20.5 | 11 | 0000 0001 011 |
| 10 | −11 | 21 | 11 | 0000 0001 101 |
| 11 | −10.5 | 21.5 | 11 | 0000 0001 111 |
| 12 | −10 | 22 | 11 | 0000 0010 001 |
| 13 | −9.5 | 22.5 | 11 | 0000 0010 011 |
| 14 | −9 | 23 | 11 | 0000 0010 101 |
| 15 | −8.5 | 23.5 | 11 | 0000 0010 111 |
| 16 | −8 | 24 | 11 | 0000 0011 001 |
| 17 | −7.5 | 24.5 | 11 | 0000 0011 011 |
| 18 | −7 | 25 | 11 | 0000 0011 101 |
| 19 | −6.5 | 25.5 | 11 | 0000 0011 111 |
| 20 | −6 | 26 | 11 | 0000 0100 001 |
| 21 | −5.5 | 26.5 | 11 | 0000 0100 011 |
| 22 | −5 | 27 | 10 | 0000 0100 11 |
| 23 | −4.5 | 27.5 | 10 | 0000 0101 01 |
| 24 | −4 | 28 | 10 | 0000 0101 11 |
| 40 | 4 | −28 | 10 | 0000 0101 10 |
| 41 | 4.5 | −27.5 | 10 | 0000 0101 00 |
| 42 | 5 | −27 | 10 | 0000 0100 10 |
| 43 | 5.5 | −26.5 | 11 | 0000 0100 010 |
| 44 | 6 | −26 | 11 | 0000 0100 000 |
| 45 | 6.5 | −25.5 | 11 | 0000 0011 110 |
| 46 | 7 | −25 | 11 | 0000 0011 100 |
| 47 | 7.5 | −24.5 | 11 | 0000 0011 010 |
| 48 | 8 | −24 | 11 | 0000 0011 000 |
| 49 | 8.5 | −23.5 | 11 | 0000 0010 110 |
| 50 | 9 | −23 | 11 | 0000 0010 100 |
| 51 | 9.5 | −22.5 | 11 | 0000 0010 010 |
| 52 | 10 | −22 | 11 | 0000 0010 000 |
| 53 | 10.5 | −21.5 | 11 | 0000 0001 110 |
| 54 | 11 | −21 | 11 | 0000 0001 100 |
| 55 | 11.5 | −20.5 | 11 | 0000 0001 010 |
| 56 | 12 | −20 | 11 | 0000 0001 000 |
| 57 | 12.5 | −19.5 | 12 | 0000 0000 1110 |
| 58 | 13 | −19 | 12 | 0000 0000 1100 |
| 59 | 13.5 | −18.5 | 12 | 0000 0000 1010 |
| 60 | 14 | −18 | 12 | 0000 0000 1000 |
| 61 | 14.5 | −17.5 | 12 | 0000 0000 0110 |
| 62 | 15 | −17 | 12 | 0000 0000 0100 |
| 63 | 15.5 | −16.5 | 13 | 0000 0000 00110 |

As illustrated above, in one embodiment, the Major Table used for variable length decoding of encoded MVD would contain all entries corresponding to VLCs having eight bits or less. Accordingly, the Minor Table would contain all entries corresponding to VLCs having more than eight bits.

As with the tables devised for decoding Huffman encoded transform coefficients, these tables have been designed to accommodate a processor with a limited data cache. Further, as will be appreciated with reference to Table 8, the allocation of table entries was again chosen to fall prior to a run of consecutive zeros. This run of consecutive zeros allows substantial savings in the storage requirements of the Minor Table. In this example, each VLC of greater than eight bits has at least five leading zeros. Thus, the table need only be indexed by eight of the thirteen bits, resulting in a saving factor of thirty-two in storage space requirements. The Minor Table, therefore, can be stored in a fraction of the space required to store the same non-optimized table that would require an index of the full thirteen bits.

HARDWARE OVERVIEW

Figure 2:
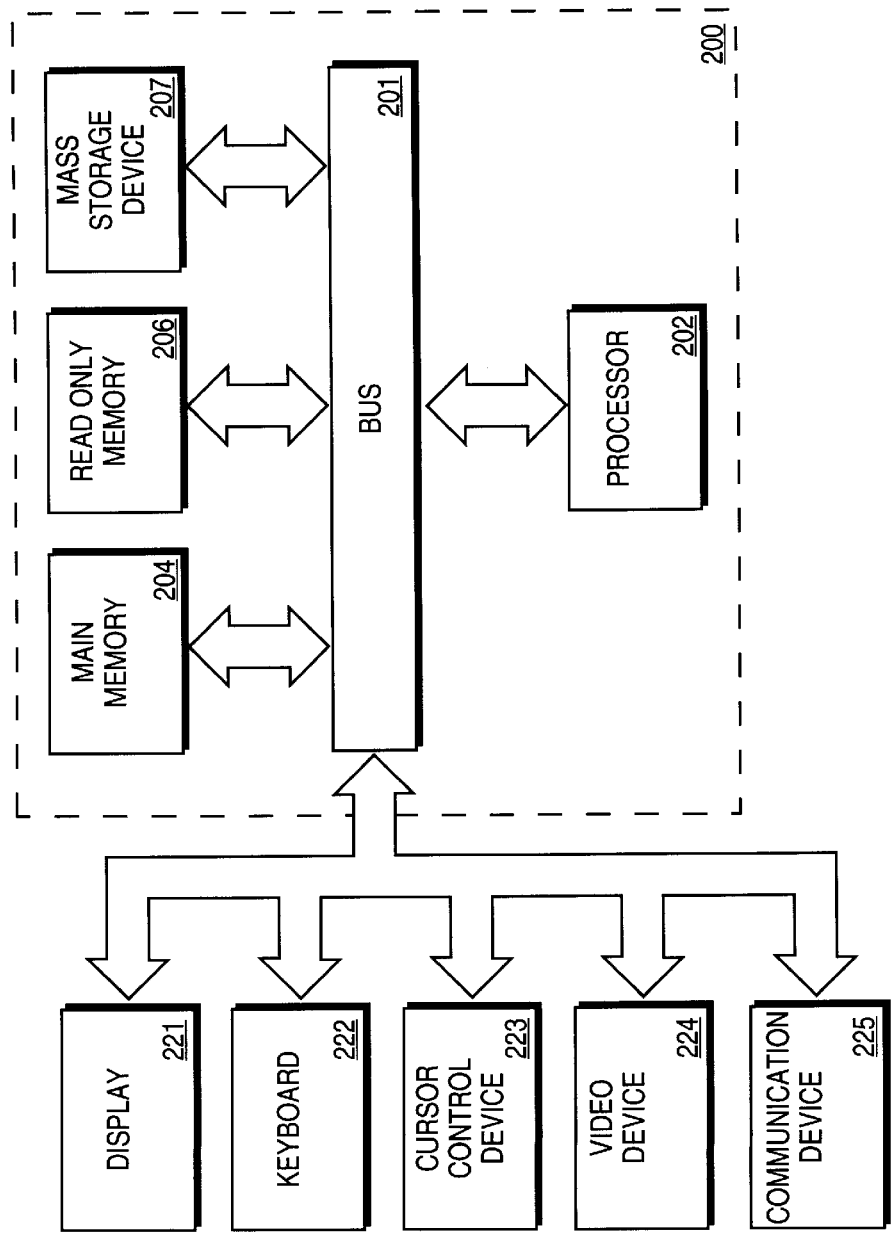
FIG. 2 is an example of a typical computer system upon which one embodiment of the present invention can be implemented.
Figure 3:
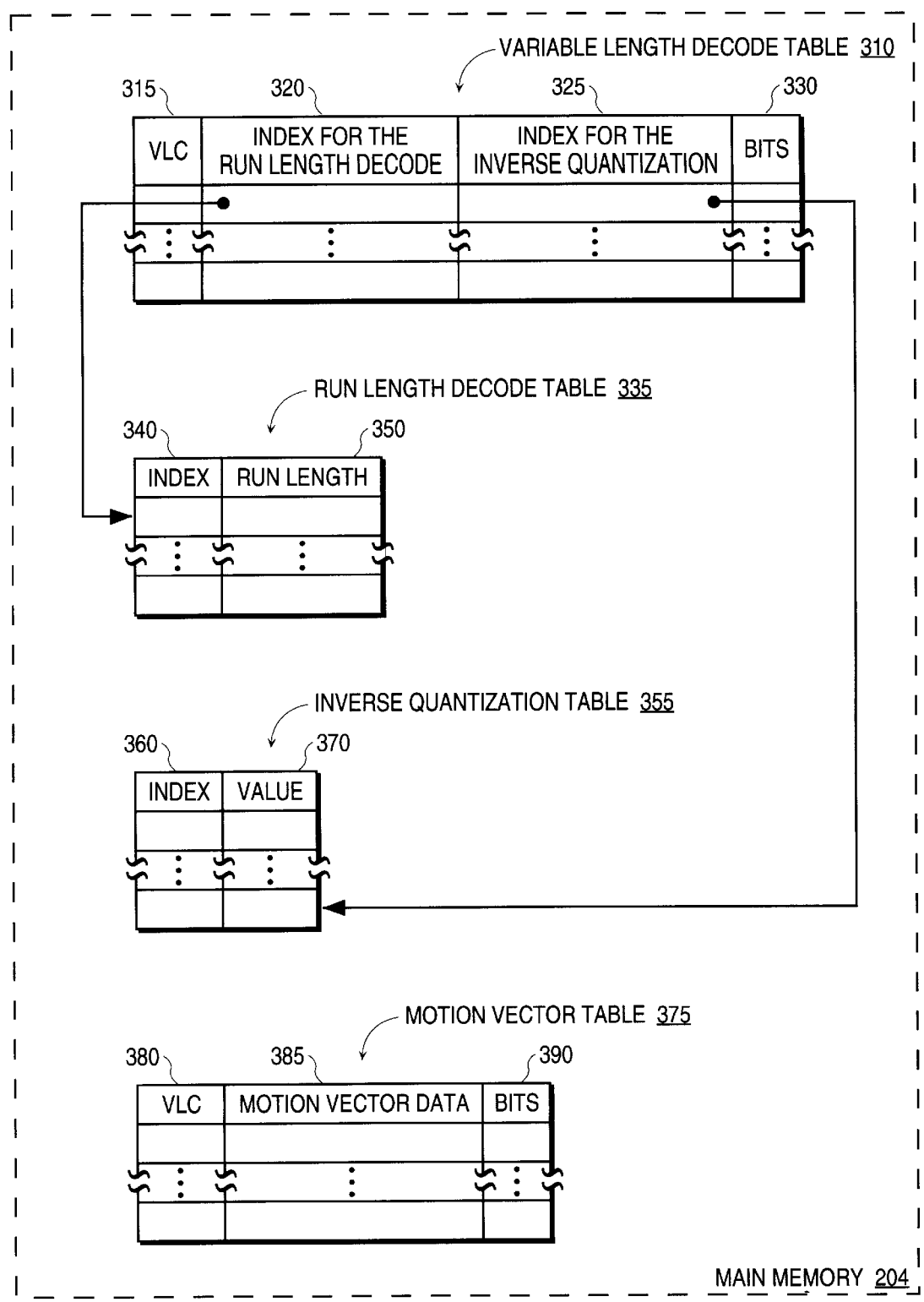
FIG. 3 depicts the memory of the computer system of FIG. 2 having stored therein a typical prior art one-level lookup table for variable length decoding.
Figure 4:
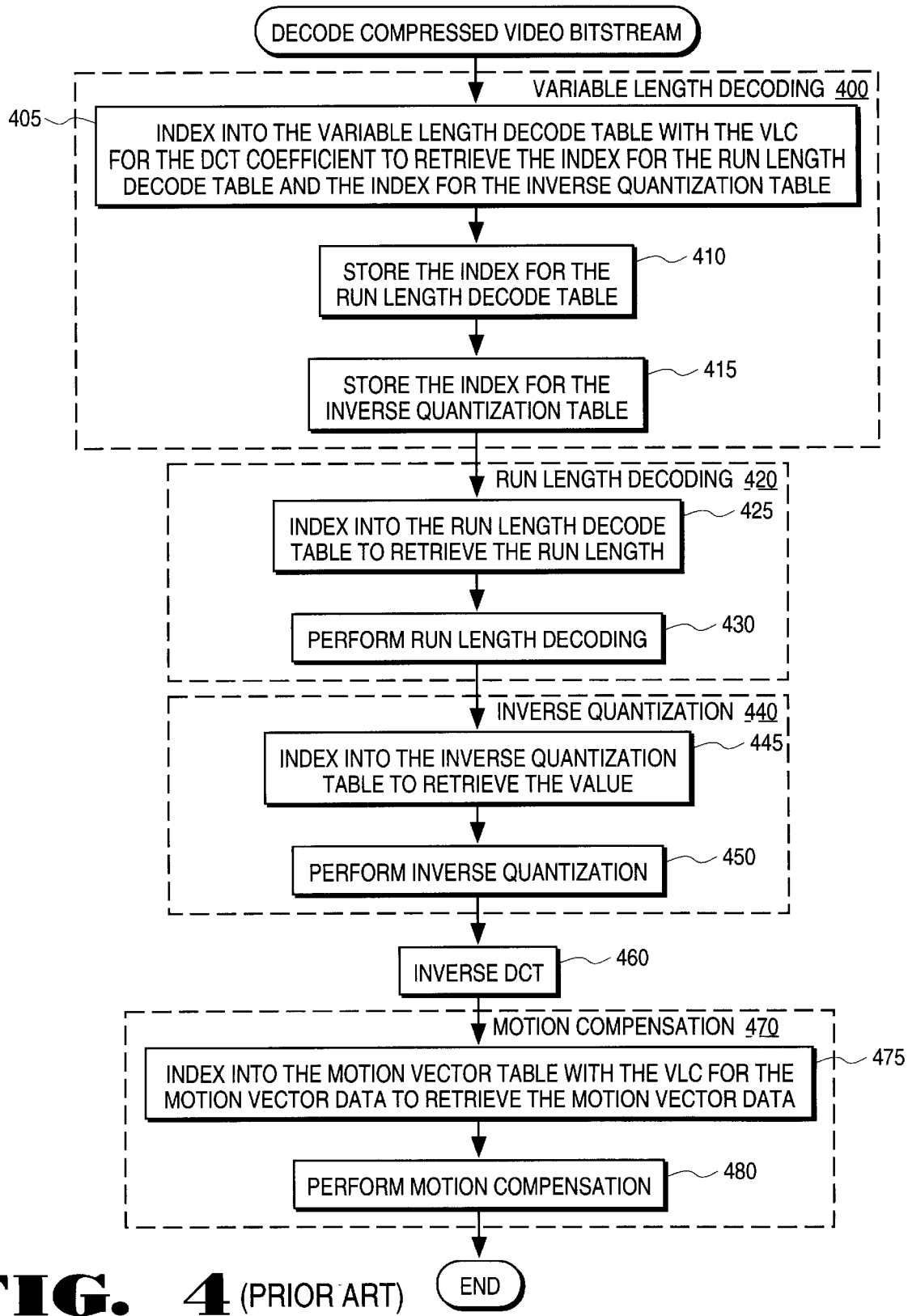
FIG. 4 is a flow diagram of a prior art video decoding method employing the tables of FIG. 3.

Referring to FIG. 2, a computer system is shown as 200. The computer system 200 represents a computer system upon which the preferred embodiment of the present invention can be implemented. Computer system 200 comprises a bus or other communication means 201 for communicating information, and a processing means 202 coupled with bus 201 for processing information. Computer system 200 further comprises a random access memory (RAM) or other dynamic storage device 204 (referred to as main memory), coupled to bus 201 for storing information and instructions to be executed by processor 202. Main memory 204 also may be used for storing temporary variables or other intermediate information during execution of instructions by processor 202. Computer system 200 also comprises a read only memory (ROM) and/or other static storage device 206 coupled to bus 201 for storing static information and instructions for processor 202. Data storage device 207 is coupled to bus 201 for storing information and instructions. A data storage device 207 such as a magnetic disk or optical disc and its corresponding drive can be coupled to computer system 200. Computer system 200 can also be coupled via bus 201 to a display device 221, such as a cathode ray tube (CRT), for displaying information to a computer user. An alphanumeric input device 222, including alphanumeric and other keys, is typically coupled to bus 201 for communicating information and command selections to processor 202. Another type of user input device is cursor control 223, such as a mouse, a trackball, or cursor direction keys for communicating direction information and command selections to processor 202 and for controlling cursor movement on display 221. This input device typically has two degrees of freedom in two axes, a first axis (e.g., x) and a second axis (e.g., y), which allows the device to specify positions in a plane. Alternatively, other input devices such as a stylus or pen can be used to interact with the display. A video device 224 can be coupled to bus 201 for input of video data. Further, a communication device 225 may be coupled to bus 201 for use in accessing other nodes of a distributed system via a network. The communication device 225 may include any of a number of commercially available networking peripheral devices such as those used for coupling to an Ethernet, token ring, Internet, or wide area network. Note that any or all of the components of the system illustrated in FIG. 2 and associated hardware may be used in various embodiments of the present invention; however, it will be appreciated by those of ordinary skill in the art that any configuration of the system may be used for various purposes according to the particular implementation.

The present invention is related to the use of computer system 200 to decode variable length codes received as part of a coded video bitstream. In one embodiment, as computer system 200 executes a program, the processor 202 accesses data stored in one or more tables within main memory 204 to facilitate variable length decoding.

Figure 5A:
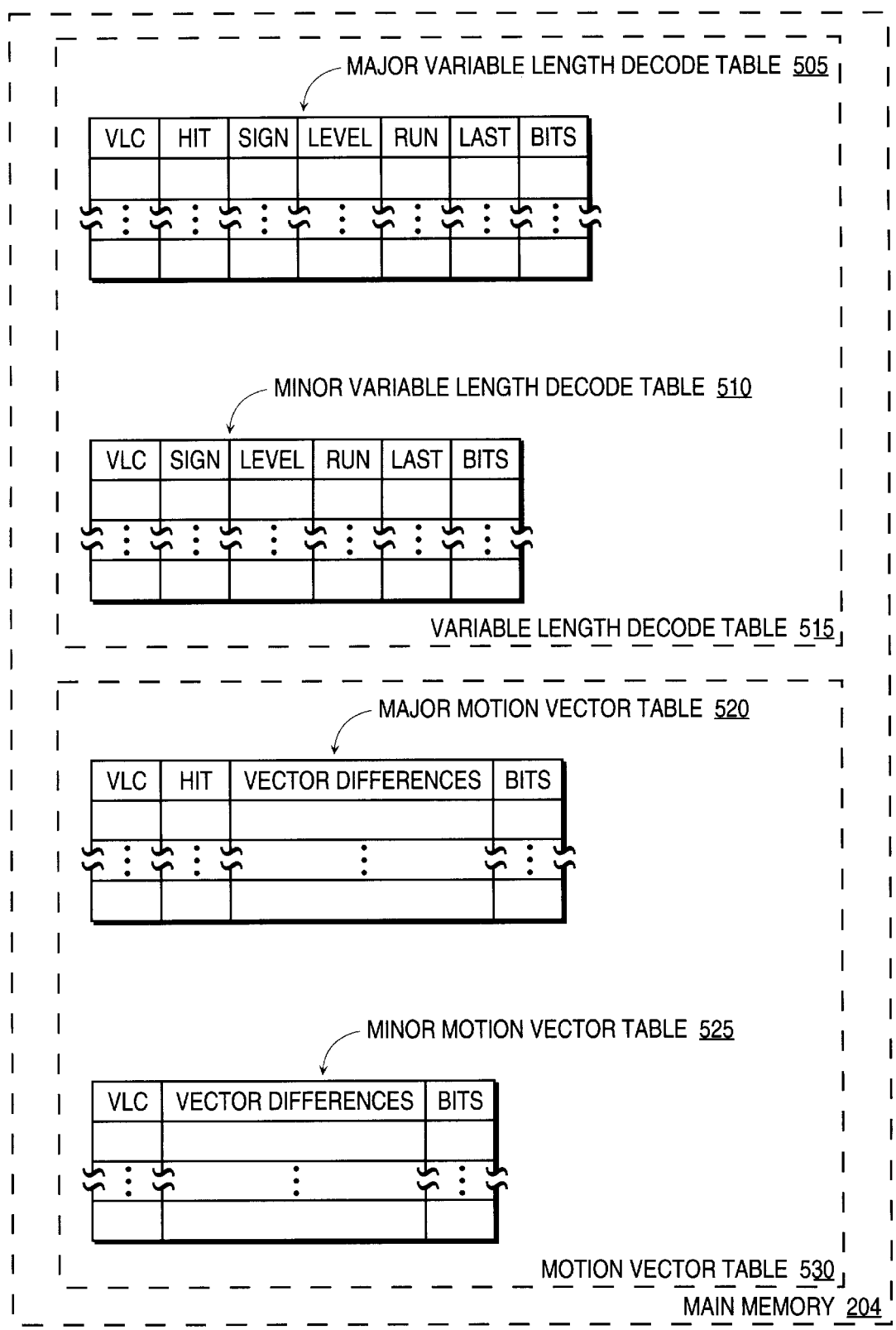
FIG. 5A depicts the main memory of the computer system of FIG. 2 having stored therein exemplary data structures for facilitating variable length decoding according to one embodiment of the present invention.

Referring now to FIG. 5A, the main memory 204 of computer system 200 is shown with exemplary data structures for facilitating variable length decoding. In one embodiment, main memory 204 stores a two-level table data structure for use in performing step 135 of FIG. 1. As discussed previously, it will be appreciated by those of ordinary skill in the art that the two-level table data structure can be represented in many ways. For example, the table might be a static structure like an array of records indexed by VLC or it may be a dynamic structure like a linked list or a binary tree, etc. In any event, the first level of the two-level table is referred to in FIG. 1 as the Major variable length decode table ("Major Table") 505. The second level of the two-level table is referred to in FIG. 1 as the Minor variable length decode table ("Minor Table") 510. The Major and Minor Tables are organized by variable length code. Therefore, given a valid variable length code, a decoded table entry can be retrieved. The formats for the decoded table entries were discussed previously with respect to Table 4 and Table 5.

In one embodiment, main memory 204 also stores a two-level table data structure for use in performing the motion compensation process, step 150 of FIG. 1. The first level of this two-level table is referred to as the Major motion vector table ("Major Table") 520. The second level of this two-level table is referred to as the Minor motion vector table ("Minor Table") 525. Again, both tables are organized and accessed by variable length code. The formats for the decoded table entries were discussed previously with respect to Table 6 and Table 7.

Alternatively, a one-level table can be used in place of either or both of these two-level tables. For example, the Major variable length decode table 505 could be combined with the Minor variable length decode table 510 to form a single table, Variable length decode table 515, containing direct values. Also, the Major motion vector table 520 could be combined with the Minor motion vector table 525 to form a single table, Motion vector table 530.

Figure 5B:
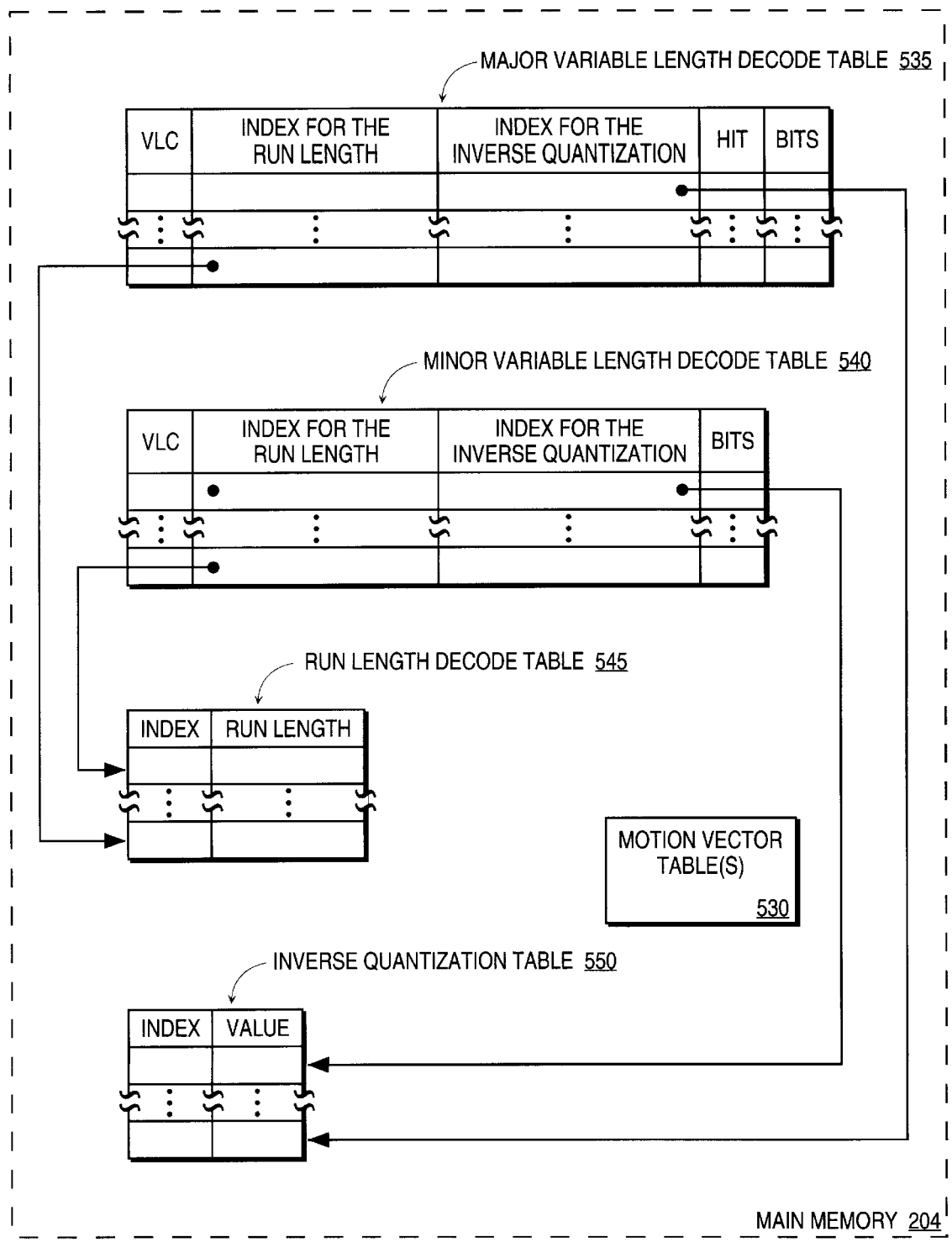
FIG. 5B depicts the main memory of the computer system of FIG. 2 having stored therein exemplary data structures for facilitating variable length decoding according to another embodiment of the present invention.

FIG. 5B depicts the main memory 204 of computer system 200 having stored therein exemplary data structures for facilitating variable length decoding according to another embodiment of the present invention. The main memory 204 contains a Major variable length decode table ("Major Table") 535, a Minor variable length decode table ("Minor Table") 540, a Run length decode table 545, and an Inverse quantization table 550. In this embodiment, the two-level tables (i.e., the Major Table and the Minor Table) store indirect, rather than direct values. That is, instead of containing direct run and level values, as shown in FIG. 5A, the Major Table 353 and the Minor Table 540 contain an index for run length and an index for inverse quantization used to index into the Run length decode table 545 and the Inverse quantization table 550, respectively.

Figure 6:
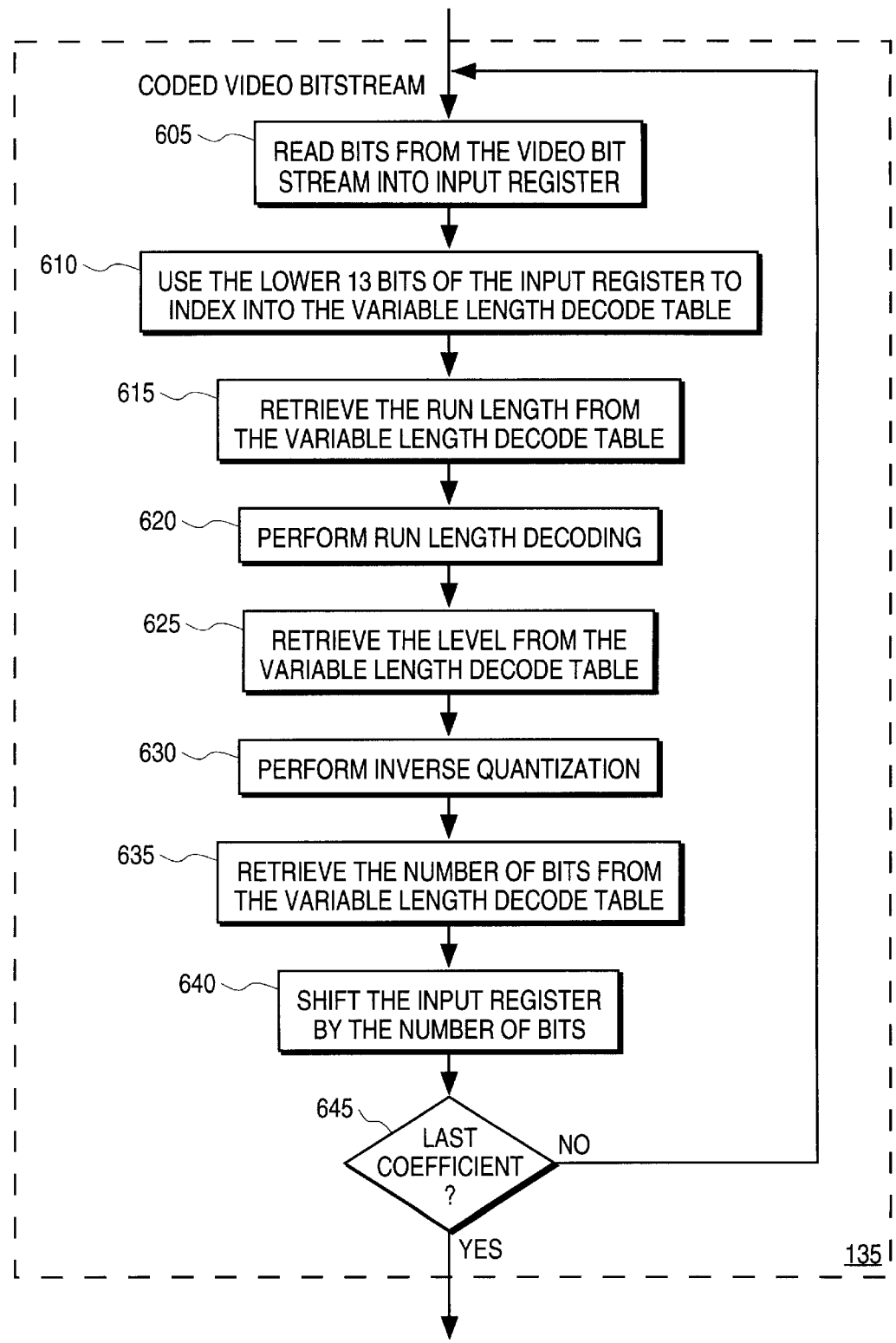
FIG. 6 is a flow diagram illustrating a method of performing variable length decoding, run length decoding, and inverse quantization according to one embodiment of the present invention using one or more of the data structures depicted in FIG. 5A.

Referring now to FIG. 6, a flow diagram illustrates a method of performing variable length decoding, run length decoding, and inverse quantization according to one embodiment of the present invention. This embodiment uses one or more of the data structures depicted in FIG. 5A. The method begins at step 605 where bits are read from the coded video bitstream into an input register. The coded video bitstream contains one or more variable length codes representing transform coefficients from the discrete cosine transform process discussed with respect to FIG. 1.

At step 610, the lower 13 bits of the input register are used to index into the variable length decode table 515. Thirteen bits are used in this example because the longest variable length code produced by an H.263 compliant encoder is thirteen bits long. Therefore, it will be appreciated that fewer or more bits would be required if the encoding scheme produced fewer or more variable length codes.

Upon accessing the variable length decode table 515, the run length is retrieved, at step 615. The run length value is input into step 620 where the run length decoding process is completed. At step 625, the level is retrieved from the variable length decode table 515. The level is then input into step 630 where the inverse quantization process is completed.

At step 635, Bits is retrieved from the variable length decode table 515. Bits indicates how many of the bits in the input register are included in the current variable length code. After the number of bits is retrieved from the variable length decode table 515, the input register is shifted by the number of bits indicated at step 640. Step 640 effectively shifts the current variable length code out of the input register to prepare for processing of the next variable length code. At this point, the next variable length code can be processed. Importantly, steps 635 and 640 need not be executed after inverse quantization and run length decoding. Steps 635 and 640 are independent of inverse quantization and run length decoding, therefore, the ordering relative to inverse quantization and run length decoding is of no consequence.

Finally, at step 645, it is determined whether or not the most recently processed variable length code was the last one of the block. If so, variable length decoding, run length decoding, and inverse quantization are complete for this block and control flows to step 140. Otherwise, if more variable length codes remain in the current block, then processing continues with step 605 until all encoded transform coefficients have been processed.

Figure 7A:
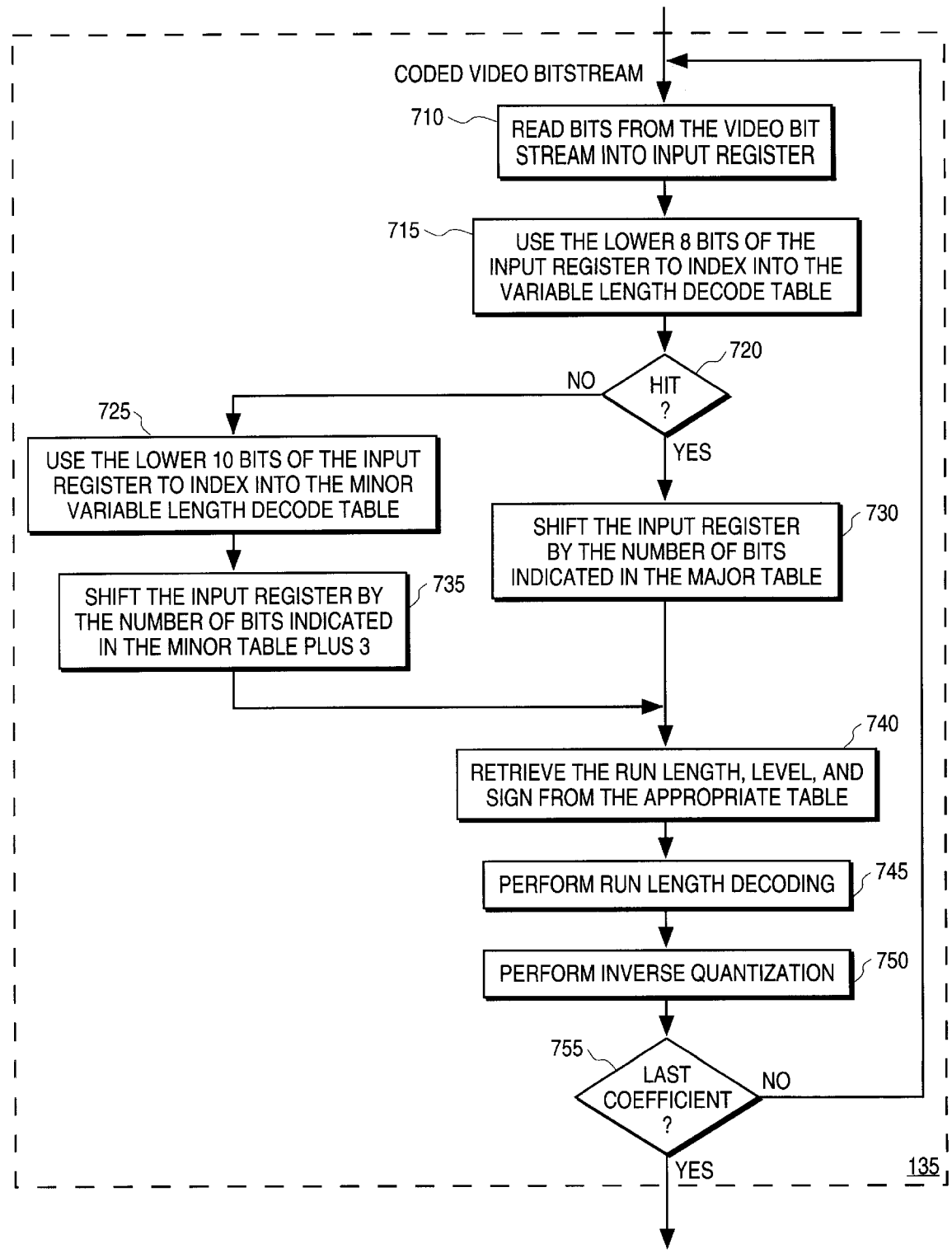
FIG. 7A is a flow diagram illustrating a method of performing variable length decoding, run length decoding, and inverse quantization according to another embodiment of the present invention using one or more of the data structures depicted in FIG. 5A.

FIG. 7A is a flow diagram illustrating a method of performing variable length decoding, run length decoding, and inverse quantization according to another embodiment of the present invention using one or more of the data structures depicted in FIG. 5A.

The method begins at step 710 where bits are read from the coded video bitstream into an input register. As discussed earlier, the coded video bitstream contains one or more variable length codes representing transform coefficients.

Initially, it must be determined which table contains the decoded table entry corresponding to the first variable length code in the input register. At step 715, the lower eight bits of the input register are used to index into the Major Table 505. Eight bits are used in this example because only decoded table entries corresponding to variable length codes of less than eight bits are stored in the Major Table 505. Of course, it is appreciated that fewer or more bits would be required if the encoding scheme required the Major Table 505 and the Minor Table 510 to be divided differently.

Upon accessing the Major Table 515, at step 720 it is determined whether or not the eight bits contain a valid variable length code. If a valid variable length code is contained within the lower eight bits of the input register, then accordingly the hit flag will be set to 0 and a decoded entry corresponding to the variable length code will be present in the Major Table 515. Assuming a hit has occurred, step 730 will be executed. At step 730, the input register is shifted by the number of bits indicated in the Major Table 505 by bits 18–25 of the decoded table entry corresponding to the variable length code. At this point, the next variable length code is aligned in the input register for processing. However, before the next variable length code is processed, control passes to step 740.

At step 720, if a hit has not occurred and no decoded entry is present in the Major Table 505 that corresponds to the lower eight bits of the input register, then the appropriate decoded entry will be found in the Minor Table 510. Upon determining that a hit has not occurred, processing branches to step 725 where the Minor Table 510 is indexed by the lower ten bits of the input register. Ten bits are used in this example because ten bits are the minimum required to uniquely identify the thirteen bit codes stored in the Minor Table. Importantly, not all thirteen bits are required due to the intelligent division of the codes between the Major Table 505 and the Minor Table 510 such that the codes left for the Minor Table 510 all have three leading zeros.

At step 735, the input register is shifted by the number of bits indicated in the Minor Table 510 by bits 17–24 of the decoded table entry corresponding to the variable length code. However, because the leading zeros would otherwise remain in the input register, at step 730, the input register is shifted by three additional bits. At this point, the next variable length code is aligned in the input register for processing. However, before the next variable length code is processed, control passes to step 740.

At step 740, the decoded table entry corresponding to the current variable length code is retrieved from the appropriate table. That is, if a hit occurred at step 720, the entry is retrieved from the Major Table 505, and if a hit did not occur at step 720, then the entry will be retrieved from the Minor Table 510. From the retrieved entry, the run length, level and sign can be accessed. Upon retrieving the decoded table entry from the appropriate table, run length decoding is performed at step 745. At step 750, inverse quantization is performed.

Finally, at step 755, it is determined whether or not the most recently processed variable length code was the last one of the block. If so, variable length decoding, run length decoding, and inverse quantization are complete for this block and control flows to step 140. Otherwise, if more variable length codes remain in the current block, then processing continues with step 710 until all encoded transform coefficients have been processed.

Figure 7B:
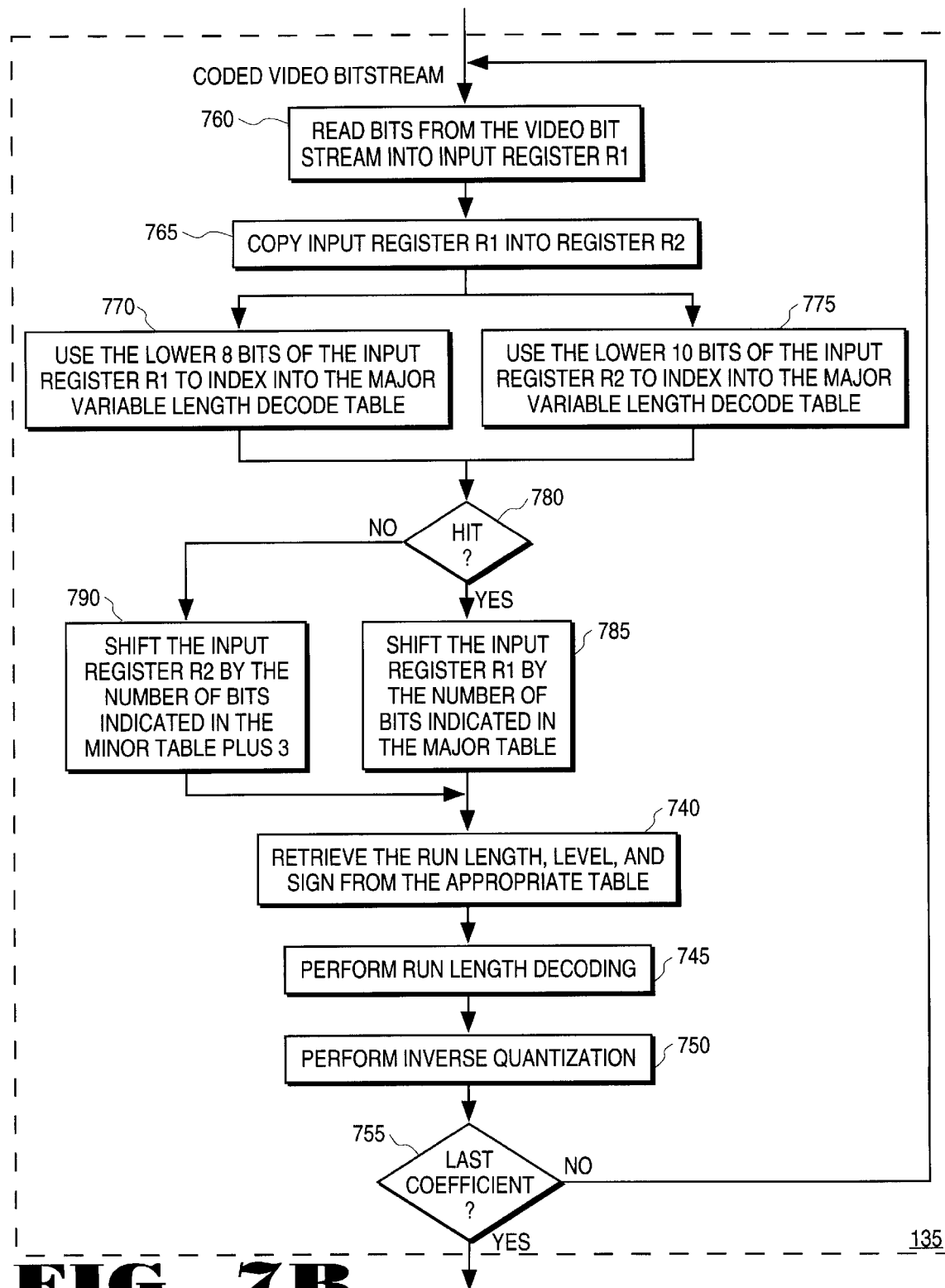
FIG. 7B is a flow diagram illustrating a method of performing variable length decoding, run length decoding, and inverse quantization in an environment supporting parallel execution according to one embodiment of the present invention.

FIG. 7B is a flow diagram illustrating the currently preferred method of performing variable length decoding, run length decoding, and inverse quantization in an environment supporting parallel execution. In the preferred embodiment, this method is performed by a Pentium® microprocessor manufactured by Intel Corporation of Santa Clara, Calif. The Pentium microprocessor allows parallel instruction execution.

The method described with respect to this figure is substantially identical to that of FIG. 7A. The differences essentially limited to the fact that two registers are used here and the steps of indexing into the Major and Minor tables can be done in parallel. Since there is much commonality between the steps involved in FIG. 7A and FIG. 7B, the descriptions of the steps here will be more brief.

The method begins at step 760 where bits are read from the coded video bitstream into an input register, R1. At step 770, a copy of the data stored to input register R1 is stored in a second register, R2. As in FIG. 7A, it is important to quickly determine which table contains the decoded table entry corresponding to the first variable length code. Therefore, the preferred method of using the two-level tables is in an environment that support parallel execution. In the preferred embodiment, steps 770 and 775 are executed in parallel.

At step 770, the lower eight bits of R1 are used to index into the Major Table 505. Concurrently, at step 775, the lower ten bits of R2 are used to index into the Minor Table 510.

At step 780 it is determined whether or not a hit has occurred in the Major Table 505. Assuming a hit has occurred, step 785 will be executed. At step 785, R1 is shifted by the number of bits indicated in the Major Table 505.

However, if it was determined at step 720, that no Major Table hit occurred, then processing continues to step 790 rather than 785. At step 790, R2 is shifted by the number of bits indicated in the Minor Table 510 plus three additional bits to clear the leading zeros.

The remaining steps 740, 745, 750, and 755 are the same as described above with respect to FIG. 7A with the exception that the "no" branch of step 755 feeds into step 760 in this embodiment.

Figure 8A:
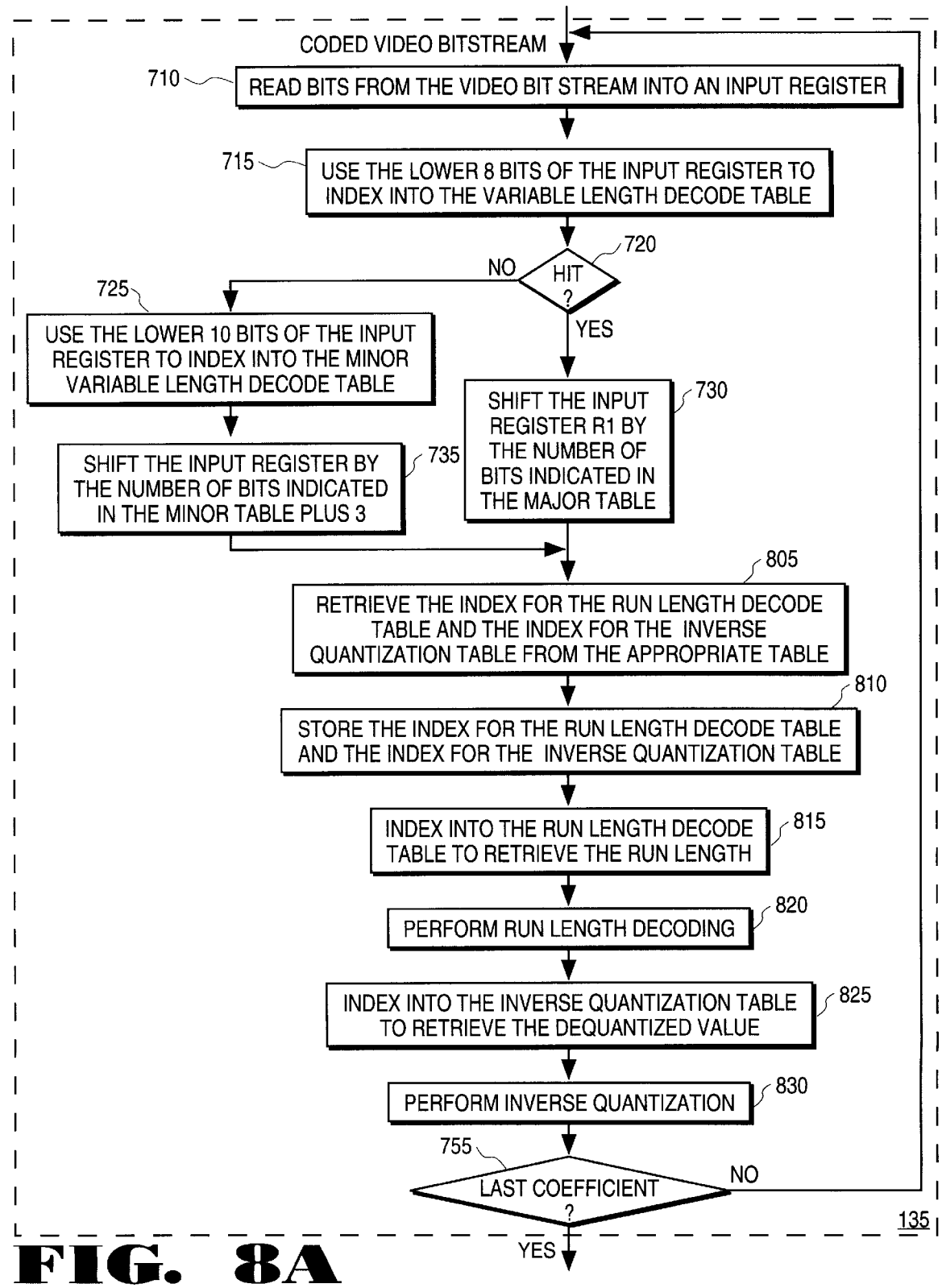
FIG. 8A is a flow diagram illustrating a method of performing variable length decoding, run length decoding, and inverse quantization according to another embodiment of the present invention using one or more of the data structures depicted in FIG. 5B.

FIG. 8A is a flow diagram illustrating a method of performing variable length decoding, run length decoding, and inverse quantization according to another embodiment of the present invention using one or more of the data structures depicted in FIG. 5B. The method described with respect to this figure is similar to that of FIG. 7A. However, in this embodiment, indirect rather than direct values are stored in the Major and Minor tables.

Since steps 710 through 735 and 755 are the same as described above with respect to FIG. 7A, they will not be described again here. However, rather than step 740 following steps 735 and 730 as previously described with reference to FIG. 7A, in this embodiment, step 805 follows steps 735 and 730.

At step 805, the index for the run length decode table 320 and the index for the inverse quantization table 325 are retrieved from the appropriate table. For example, if there was a Major Table hit at step 720, then the table entry from the Major Table 535 will be used. Otherwise, if the table entry is not contained in the Major Table 535, then the indices will be retrieved from the Minor Table 540. The retrieved indices are stored at steps 810.

At step 815, the stored index for the run length decode table is used to index into the run length decode table 545. The run length value is then used to perform run length decoding at step 820.

At step 825, the stored index for the inverse quantization table is used to index into the inverse quantization table 550. The dequantized value is then used to perform inverse quantization at step 830.

Figure 8B:
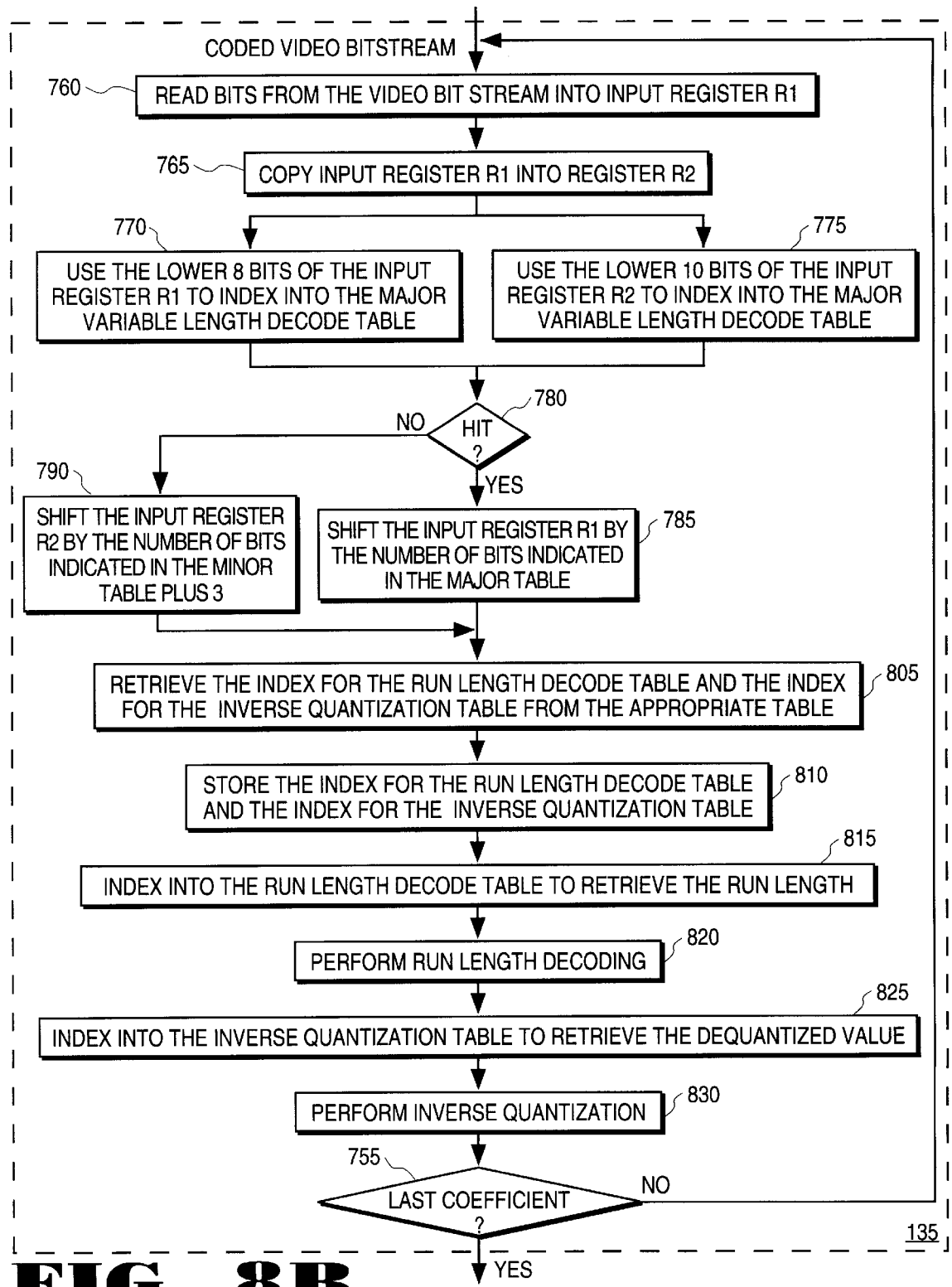
FIG. 8B is a flow diagram illustrating a method of performing variable length decoding, run length decoding, and inverse quantization in an environment supporting parallel execution according to another embodiment of the present invention.

FIG. 8B is a flow diagram illustrating a method of performing variable length decoding, run length decoding, and inverse quantization in an environment supporting parallel execution according to another embodiment of the present invention. The method described with respect to this figure is a combination of previously described steps found in FIG. 7B and FIG. 8A. However, rather than step 740 following steps 785 and 790 as previously described with reference to FIG. 7B, in this embodiment, step 805 follows steps 785 and 790.

Figure 9A:
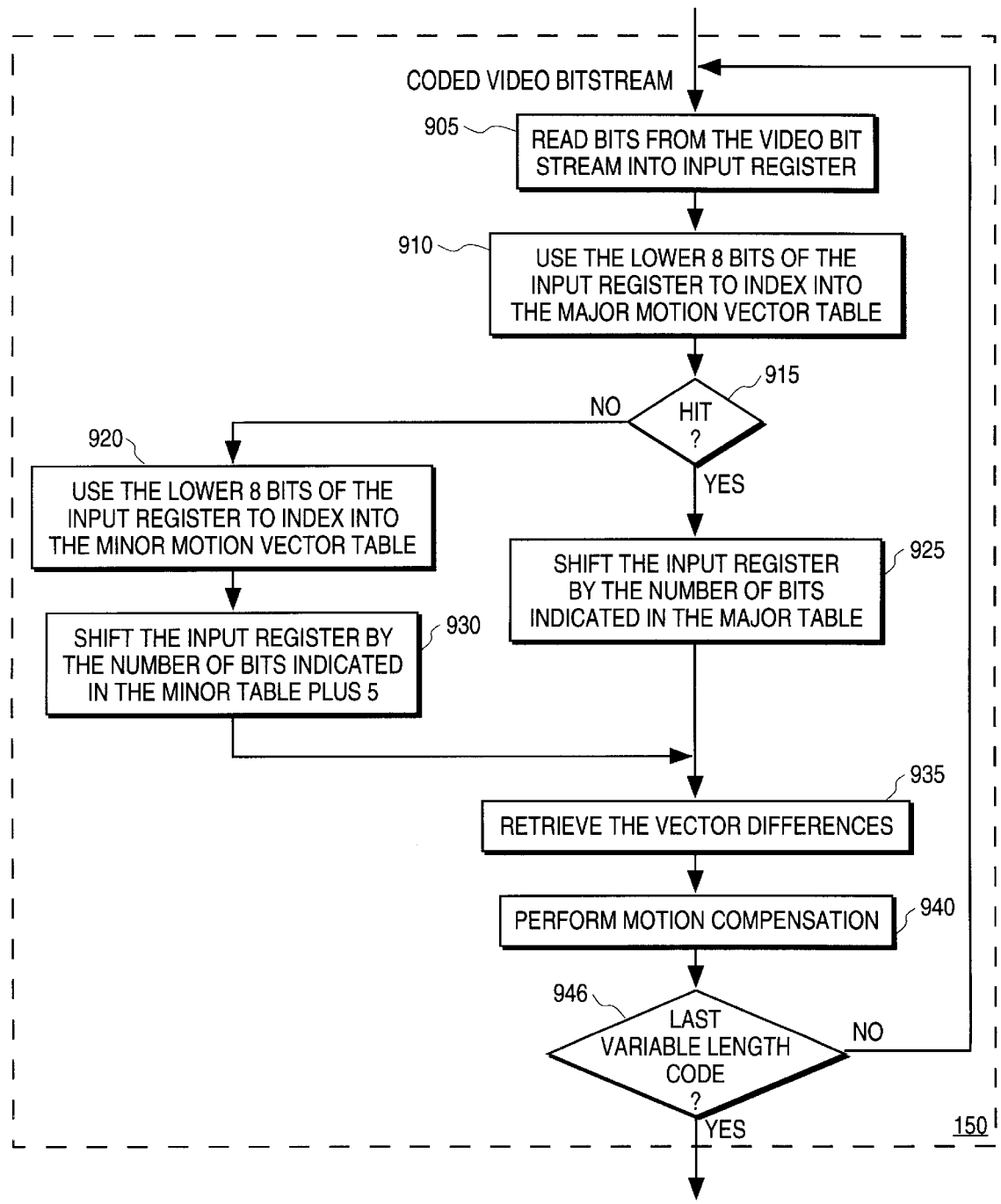
FIG. 9A is a flow diagram illustrating a method of decoding variable length coded motion vectors and then performing motion compensation according to one embodiment of the present invention.

FIG. 9A is a flow diagram illustrating a method of decoding variable length coded motion vectors and then performing motion compensation according to one embodiment of the present invention.

The method begins at step 905 where bits are read from the bitstream output from step 140 into an input register. The dequantized bitstream no longer contains variable length codes representing transform coefficients; however, at this point it still contains variable length codes representing motion vector data. The method of decoding variable length codes for use in motion compensation is substantially the same as the approach used with respect to variable length decoding, run length decoding, and inverse quantization discussed above. However, because a different encoding process is used for the motion vector data, different tables are required for decoding the variable length codes.

At step 910, the lower eight bits of the input register are used to index into the Major Table 520. Eight bits are used in this example because only decoded table entries corresponding to variable length codes of eight bits or less are stored in the Major Table 520. Again, it is appreciated that fewer or more bits would be required if the encoding scheme required the Major Table 520 and the Minor Table 525 to be divided differently.

At step 915 it is determined whether or not a Major Table hit has occurred. If the variable length code corresponding to the lower eight bits of the input register have a corresponding decoded table entry in the Major Table 520, then processing continues with step 925. However, if a hit has not occurred, then processing branches to step 920.

At step 920, the Minor Table 510 is indexed by the lower eight bits of the input register, eight bits are used in this example because only eight bits are required to uniquely identify the thirteen bit codes employed by H.263 for motion vector data encoding. Once again, not all thirteen bits are required due to the intelligent division of the codes between the Major Table 520 and the Minor Table 525 such that the codes left for the Minor Table 525 all have five leading zeros.

At step 925, the input register is shifted by the number of bits indicated in the Major Table 520. After step 925, processing continues with step 935.

At step 930, the input register is shifted by the number of bits indicated in the Minor Table 525 plus five bits. After step 930, processing continues with step 935.

At step 935, the decoded table entry corresponding to the current variable length code is retrieved from the appropriate table. That is, if a hit occurred at step 915, the entry is retrieved from the Major Table 520, and if a hit did not occur at step 915, then the entry will be retrieved from the Minor Table 525. From the retrieved entry, the vector differences can be accessed. Upon retrieving the decoded table entry from the appropriate table, motion compensation is performed at step 940. At step 750, inverse quantization is performed.

Finally, at step 946, it is determined whether or not the most recently processed variable length code was the last one of the block. If so, the process of motion vector decoding and motion compensation is complete for this block. Otherwise, if more variable length codes remain in the current block, then processing continues with step 905 until all of the encoded motion vector data for this block has been processed.

Figure 9B:
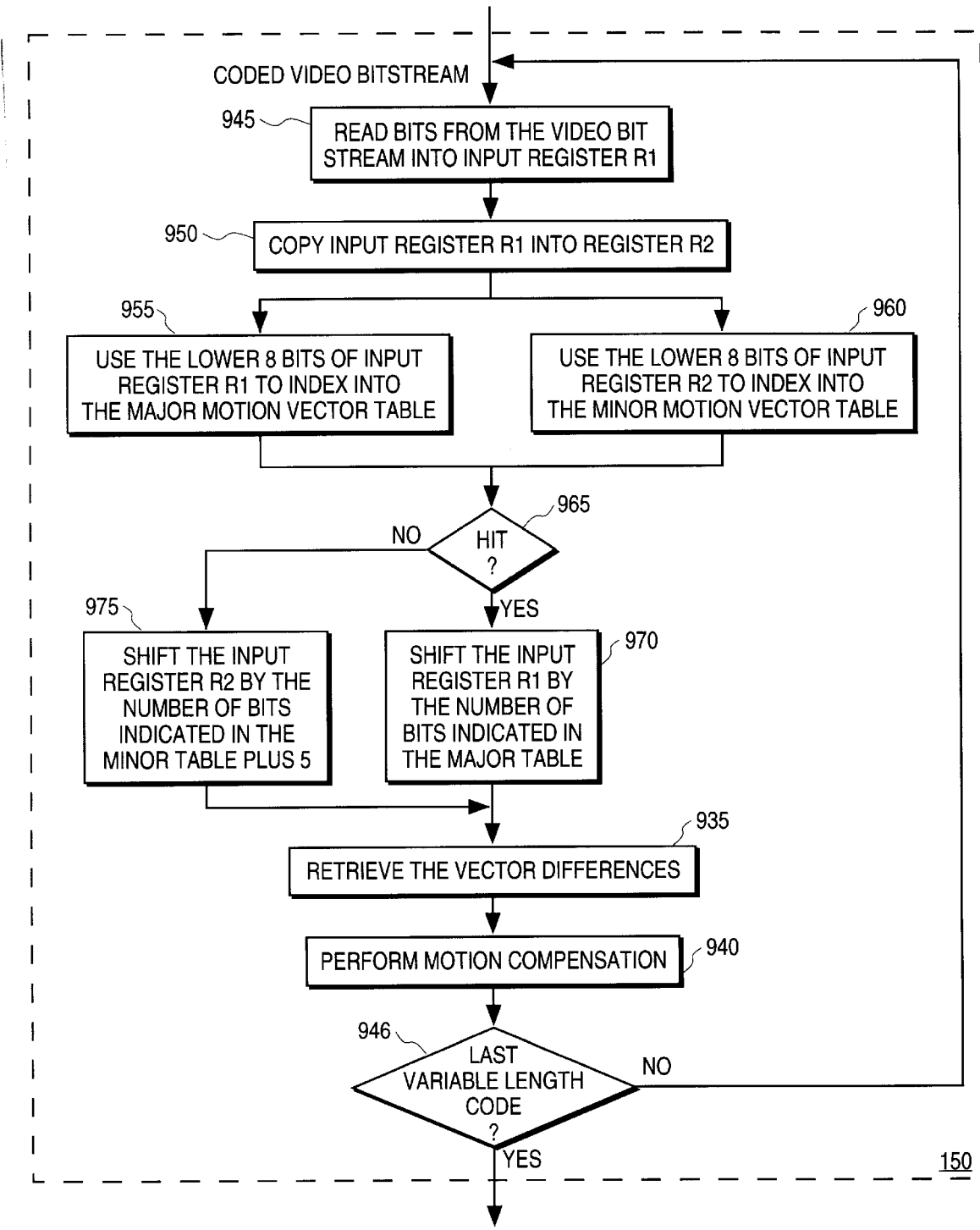
FIG. 9B is a flow diagram illustrating a method of decoding variable length coded motion vectors and then performing motion compensation in an environment supporting parallel execution according to another embodiment of the present invention.

FIG. 9B is a flow diagram illustrating a method of decoding variable length coded motion vectors and then performing motion compensation in an environment supporting parallel execution according to another embodiment of the present invention.

The method begins at step 945 where bits are read from the bitstream into an input register, R1. At step 950, a copy of the data stored to input register R1 is stored in a second register, R2. In this embodiment, steps 955 and 960 are executed in parallel.

At step 955, the lower eight bits of R1 are used to index into the Major Table 520. Concurrently, at step 960, the lower eight bits of R2 are used to index into the Minor Table 525.

At step 965 it is determined whether or not a hit has occurred in the Major Table 520. Assuming a hit has occurred, step 970 will be executed. At step 970, R1 is shifted by the number of bits indicated in the Major Table 520.

However, if it was determined at step 965, that no Major Table hit occurred, then processing continues to step 975 rather than 970. At step 975, R2 is shifted by the number of bits indicated in the Minor Table 525 plus five additional bits to clear the leading zeros.

The remaining steps 740, 745, 750, and 755 are the same as described above with respect to FIG. 7A with the exception that the "no" branch of step 755 feeds into step 760 in this embodiment.

The remaining steps, steps 935, 940 and 946 are the same as described with respect to FIG. 9A, except, in this embodiment, the "no" branch from step 946 flows into step 945.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A method of performing variable length decoding on a coded bitstream, the method comprising the steps of:
   receiving a coded bitstream;
   determining which of a major table or a minor table contains an entry corresponding to a first variable length code (VLC) of the code bitstream, said major table containing entries corresponding to frequently used VLCs, said minor table containing entries corresponding to less frequently used VLCs;
   retrieving the entry corresponding to the VLC from the table determined to contain the entry in said determining step; and
   performing both run length decoding and inverse quantization for the first VLC prior to determining a next entry corresponding to a second VLC.

2. The method of claim 1 wherein said step of determining which of a major table or a minor table contains an entry corresponding to a first VLC further comprises the steps of:
   concurrently executing the following steps
      indexing into the major table with a portion of a set of bits stored in a first register to determine if the major table contains the decoded entry corresponding to the VLC contained within the portion of said set of bits stored in said first register, and
      indexing into the minor table with a portion of a set of bits stored in a second register to retrieve the corresponding decoded entry.

3. The method of claim 1 wherein said major table comprises a first plurality of entries and said minor table comprises a second plurality of entries, and wherein said first plurality of entries and said second plurality of entries are mutually exclusive.

4. The method of claim 1 wherein the longest VLC contains x bits, said method further comprising the steps of:
   indexing into said major table with y bits from said coded video bitstream, wherein y is less than x; and
   upon determining the entry is contained within said minor table, indexing into the minor table with z bits from said coded video bitstream, wherein z is less than x.

5. The method of claim 4 wherein said entry contains motion vector data, said method further comprising the step of performing motion vector decoding based upon said motion vector data.

6. A computer system comprising:
   a processor configured to receive a coded video bitstream, said coded video bitstream containing a plurality of variable length codes (VLCs) including a first VLC; and
   a memory coupled to said processor, said memory having stored therein
      a table including information for use by a program to facilitate efficient decoding of the coded video bitstream, and
      sequences of instructions which, when executed by said processor, cause said processor to perform the steps of:
         retrieving an entry from the table corresponding to the first VLC; and performing multiple functions together in a single loop, the multiple functions including run length decoding and inverse quantization using the retrieved entry.

7. A method of performing variable length decoding, comprising the steps of:
   receiving a coded bitstream;
   for each variable length code (VLC) in the coded bitstream
      concurrently
         retrieving a first entry from a first table based upon a first subset of bits from the coded bitstream, the first table containing entries corresponding to statistically frequently occurring VLCs, and
         retrieving a second entry from a second table base upon a second subset of bits from the coded bitstream, the second table containing entries corresponding to statistically less frequently occuring VLCs; and
      decoding the VLC based upon the entry of the first or second entry that corresponds to the VLC.

8. The method of claim 7, wherein the first entry includes:
   (1) a value of a transform coefficient corresponding to the VLC;
   (2) a number indicating the number of preceding transform coefficients having a value of zero; and
   (3) an indication of whether or not the VLC corresponds to the last non zero transform coefficient.

9. The method of claim 7, wherein the method further comprises the step of determining whether or not the first entry corresponds to the VLC based upon a hit indication in the first entry.

10. A table driven method of decoding a coded video bitstream, the method comprising the steps of:
   (A) receiving a coded video bitstream comprising one or more variable length codes (VLCs);
   (B) decoding a current VLC by (1) reading a set of bits from said coded video bitstream,
(2) selecting a major table or a minor table from which to retrieve an entry, the entry including at least a VLC length, a run length, and a coefficient value, the step of selecting including determining which of the major table or the minor table contains an entry corresponding to the current VLC,
(3) performing variable length decoding based upon the VLC length,
(4) performing run length decoding based upon the run length, and
(5) performing inverse quantization based upon the second value; and (C) continuing with step (B) if the current VLC does not correspond to the last coefficient.

11. The method of claim 10, wherein said step of selecting a major table or a minor table from which to retrieve an entry further comprises the step of concurrently indexing into the major table with a first subset of the set of bits to determine if the major table contains the entry corresponding to the current VLC, and indexing into the minor table with a second subset of the set of bits to retrieve the corresponding entry.

12. A computer system comprising:
a storage device having stored therein a two-level data structure including a first level containing entries corresponding to statistically frequently occurring VLCs and a second level containing entries corresponding to statistically less frequently occurring VLC, and a decoding routine for retrieving entries from the two-level data structure and performing variable length decoding, run length decoding, and inverse quantization on a coded bitstream; and
a processor coupled to the storage device for executing the decoding routine, where:
an outer loop of the decoding routine processes a current block of a coded bitstream each iteration, and
a single inner loop of the decoding routine performs variable length decoding, run length decoding, and inverse quantization for each VLC of the current block based upon entries retrieved from the first or second level of the two-level data structure.

* * * * *